(12) United States Patent
Cui et al.

(10) Patent No.: US 10,157,956 B2
(45) Date of Patent: Dec. 18, 2018

(54) METHOD OF MONOLITHIC INTEGRATION OF HYPERSPECTRAL IMAGE SENSOR

(71) Applicant: INSTITUTE OF MICROELECTRONICS, CHINESE ACADEMY OF SCIENCES, Beijing (CN)

(72) Inventors: Hushan Cui, Beijing (CN); Jinjuan Xiang, Beijing (CN); Xiaobin He, Beijing (CN); Tao Yang, Beijing (CN); Junfeng Li, Beijing (CN); Chao Zhao, Belgium (BE)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/477,191

(22) Filed: Apr. 3, 2017

(65) Prior Publication Data

US 2017/0294478 A1 Oct. 12, 2017

(30) Foreign Application Priority Data

Apr. 7, 2016 (CN) .......................... 2016 1 0214392

(51) Int. Cl.
*H01L 21/00* (2006.01)
*H01L 27/146* (2006.01)
(Continued)

(52) U.S. Cl.
CPC .. *H01L 27/14685* (2013.01); *H01L 27/14621* (2013.01); *H01L 27/14625* (2013.01);
(Continued)

(58) Field of Classification Search
CPC ......... H01L 27/14685; H01L 27/14687; H01L 27/14629; H01L 27/14625;
(Continued)

(56) References Cited

U.S. PATENT DOCUMENTS

| 8,035,710 B2 * | 10/2011 | Koyama ................ G02B 5/201 257/290 |
| 2007/0285539 A1 * | 12/2007 | Shimizu ............ H01L 27/14621 348/272 |

(Continued)

FOREIGN PATENT DOCUMENTS

| CN | 101211946 A | 7/2008 |
| CN | 102054772 A | 5/2011 |
| CN | 203259680 U | 10/2013 |

OTHER PUBLICATIONS

Chinese 1st Office Action; Application No. 201610214392.0 dated Mar. 23, 2018.

*Primary Examiner* — Shouxiang Hu
(74) *Attorney, Agent, or Firm* — Goodwin Procter LLP

(57) ABSTRACT

A method for monolithic integration of a hyperspectral image sensor is provided, which includes: forming a bottom reflecting layer on a surface of the photosensitive region of a CMOS image sensor wafer; forming a transparent cavity layer composed of N step structures on the bottom reflecting layer through area selective atomic layer deposition processes, where $N=2^m$, $m \geq 1$ and m is a positive integer; and forming a top reflecting layer on the transparent cavity layer. With the method, non-uniformity accumulation due to etching processes in conventional technology is minimized, and the cavity layer can be made of materials which cannot be etched. Mosaic cavity layers having such repeated structures with different heights can be formed by extending one-dimensional ASALD, such as extending in another dimension and forming repeated regions, which can be applied to (Continued)

snapshot hyperspectral image sensors, for example, pixels, and greatly improving performance thereof.

13 Claims, 21 Drawing Sheets

(51) Int. Cl.
*H01L 31/0216* (2014.01)
*H01L 31/0232* (2014.01)

(52) U.S. Cl.
CPC .. *H01L 27/14629* (2013.01); *H01L 27/14632* (2013.01); *H01L 27/14687* (2013.01); *H01L 31/02162* (2013.01); *H01L 31/02327* (2013.01)

(58) Field of Classification Search
CPC ......... H01L 31/02162; H01L 27/14621; H01L 31/02327; H01L 27/14632; H01L 31/02165
See application file for complete search history.

(56) References Cited

U.S. PATENT DOCUMENTS

| | | | |
|---|---|---|---|
| 2012/0001285 A1* | 1/2012 | Kokubun | H01L 27/14621 257/432 |
| 2012/0327248 A1* | 12/2012 | Tack | G01J 3/26 348/164 |
| 2014/0327099 A1* | 11/2014 | Boudreau | H01L 27/14629 257/432 |
| 2014/0377963 A1 | 12/2014 | Ellinger et al. | |

\* cited by examiner

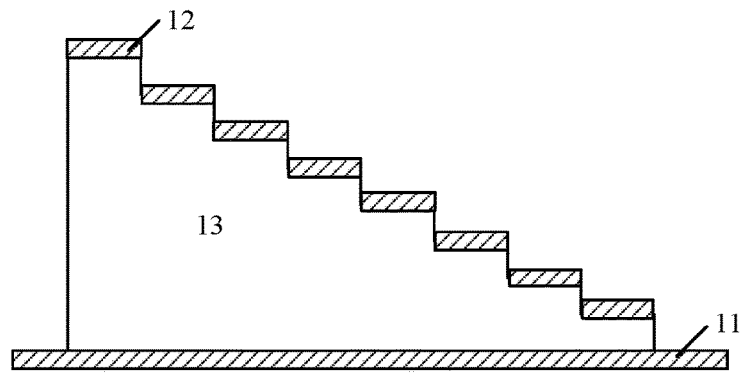
Figure 1    (Prior Art)
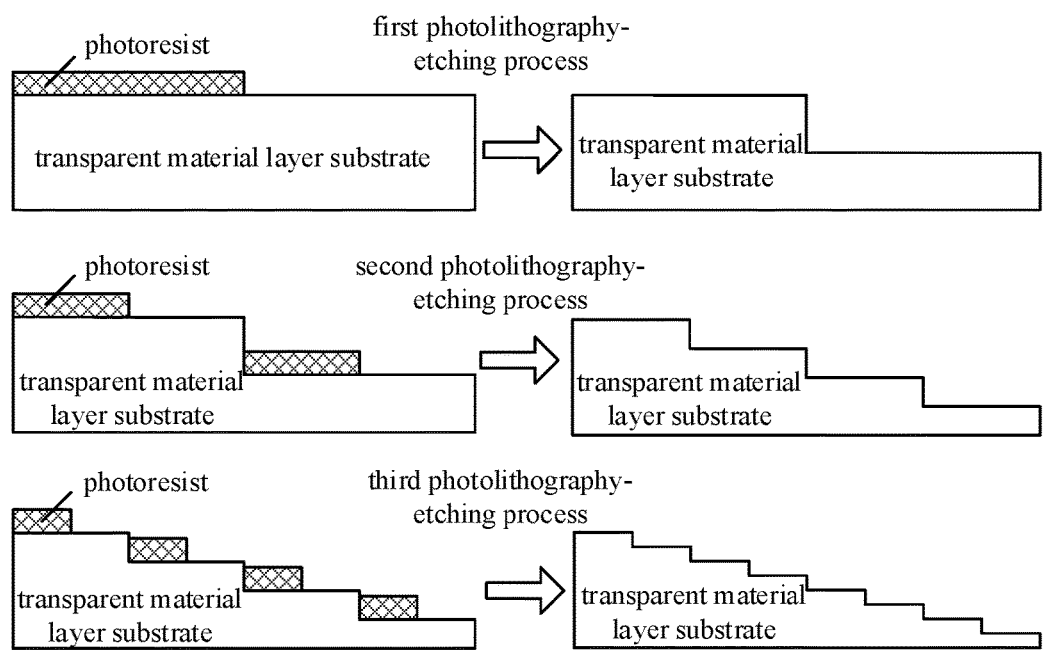
Figure 2    (Prior Art)

METHOD OF MONOLITHIC INTEGRATION OF HYPERSPECTRAL IMAGE SENSOR

CROSS-REFERENCE TO RELATED APPLICATION

This application claims priority to Chinese Patent Application No. 201610214392.0, titled "METHOD OF MONOLITHIC INTEGRATION OF HYPERSPECTRAL IMAGE SENSOR," filed with the State Intellectual Property Office of the People's Republic of China on Apr. 7, 2016, which is hereby incorporated by reference in its entirety.

FIELD

The present disclosure relates to the technical field of hyperspectral imaging, and in particular to a method for monolithic integration of a hyperspectral image sensor.

BACKGROUND

With help of hyperspectral imaging technology, a continuous spectrum can be divided into multiple spectral bands containing certain range of wavelengths, therefore, desired spectral bands can be further analyzed individually more in detail. Hence, hyperspectral imaging technology is widely applied to technical fields such as remote sensing, food science and bio-medical research. A previous hyperspectral imaging system is based on laboratory setups, therefore it slows in analysis speed, high in cost and not compact at all. In order to solve the above problems, a hyperspectral imager was implemented by monolithically integrating a wedge filter on top of a CMOS image sensor by the researchers of Interuniversity Microelectronics Center (IMEC).

As presented by IMEC, the method for fabricating a hyperspectral image sensor is by monolithically integrating a wedge filter on top of the photosensitive region of a CMOS image sensor. Such kind of hyperspectral image sensors, compared to the laboratory style ones, have much smaller volume, faster analysis speed and lower cost. A filter integrated on the top of the CMOS image sensor is generally a set of Fabry-Pérot interferometers (Fabry-Pérot interferometers), as shown in FIG. 1. The Fabry-Péinterferometers include two highly reflective layers (mirrors), a bottom reflecting layer 11 and a top reflecting layer 12; and a transparent cavity layer is placed in between the two reflecting layers 11 and 12. The transparent cavity layer 13 is a wedge structure, and each step height corresponds to one spectral band.

The transparent cavity layer defines the cavity length where light can be reflected in between the two mirrors.

In conventional technology as IMEC implemented, the transparent cavity layer with step structures is fabricated by alternating photolithography-etching steps. For example, a transparent cavity layer with eight step heights is fabricated with three sets of photolithography-etching processes, as shown in FIG. 2.

A height of the cavity layer determines a wavelength of a central spectrum of a corresponding filter, hence in a multi-step Fabry-Pérot interferometer (for example, one with more than 100 step structures), the heights of the cavity layer must be fabricated very precisely. Practically, it is reported that etching depths have within wafer non-uniformity of at least about 2.7% during each etching process, which means that the more etching steps are performed, the greater the non-uniformity. As a transparent cavity layer composed of multiple step structures requires multiple etching steps, thus, accumulation of the non-uniformity increases as the etching steps increases. Therefore, the device may be failed due to being out of the specifications.

In addition, it is difficult to apply plasma etching or wet etching to etch some specific materials, for example, hafnium(IV) oxide ($HfO_2$). Since the boiling points of the halides of the lanthanide transition metals (including Hf) are high (higher than 300 degrees Celsius), it is difficult to etch those halides up through plasma etching. A reagent based on containing rich hydrogen fluoride (HF) molecules may be used for wet etching of $HfO_2$, however the reagent containing HF normally will destroy the interface layer of photoresist and $HfO_2$. Therefore, it may result of lifting off the photoresist. To overcome the issue, a hard mask has to be added, thereby it increases process steps, cost and uncertainties. Thus, if the transparent cavity layer is fabricated by photolithography-etching processes, the selection of materials for the transparent cavity layer is restricted due to etching process.

SUMMARY

In order to solve the problem of bad height uniformity of step structures and device failure caused by etching processes and extend the selection range of materials for the transparent cavity layer, a method for monolithic integration of a hyperspectral image sensor is provided according to the present disclosure.

In order to solve the above technical problems, the following technical solution is provided according to the present disclosure.

A method for monolithic integration of a hyperspectral image sensor is provided, which includes:

preprocessing the surface of the photosensitive region of a CMOS image sensor wafer, to flatten the surface of the photosensitive region;

forming a bottom reflecting layer on the preprocessed surface of the photosensitive region of the CMOS image sensor wafer;

forming a transparent cavity layer on the bottom reflecting layer by using area selective atomic layer deposition (ASALD) processes, where the transparent cavity layer is composed of N step structures, where $N=2^m$, $m \geq 1$ and m is a positive integer; and forming a top reflecting layer on the transparent cavity layer.

Compared with conventional technology, the invention has the following beneficial effects.

As the atomic layer deposition process has a feature of excellent deposition uniformity, hence in the present disclosure, the N step structures formed on the bottom reflecting layer by using the area selective atomic layer deposition (ASALD) process have the same height within wafer. Thereby, with the method for monolithic integration of a hyperspectral image sensor according to the present disclosure, the problem of height non-uniformity of step structures within wafer is greatly minimized. Heights of the formed step structures are determined by conditions of the area selective atomic layer deposition process, for example, the number of deposition cycles. And, film deposition non-uniformity (<1.5%) of the ALD process is much smaller than that of the photolithography-etching process (2.7%) in practical (for example, ALD-$Al_2O_3$ films). Hence, with the method for monolithic integration of a hyperspectral image sensor according to the present disclosure, the problem of non-uniformity accumulation due to the etching process in conventional technology is greatly minimized. Thereby, it is beneficial to reduce device failure rate so to increase the yield.

In addition, the ALD process can be used to generate various types of film materials which are not necessarily to be etched easily. Hence, compared with the photolithography-etching process, the method for monolithic integration of a hyperspectral image sensor according to the present disclosure can be applied more widely in the aspect of material selection of a cavity layer.

BRIEF DESCRIPTION OF THE DRAWINGS

In order for a clearer understanding of the embodiments according to the present disclosure, drawings to be used in the description of the embodiments according to the present disclosure are described briefly hereinafter. Apparently, these drawings only describe some embodiments of the invention, and other drawings may be obtained by those skilled in the art without any creative work.

FIG. 1 is a cross section structure of a Fabry-Pérot interferometer according to a related technical filed;

FIG. 2 is a schematic diagram showing cross section of the structures corresponding to fabrication processes of a transparent cavity layer with eight step structures fabricated by using photolithography-etching processes according to conventional technology;

DETAILED DESCRIPTION OF THE EMBODIMENTS

Figure 3:
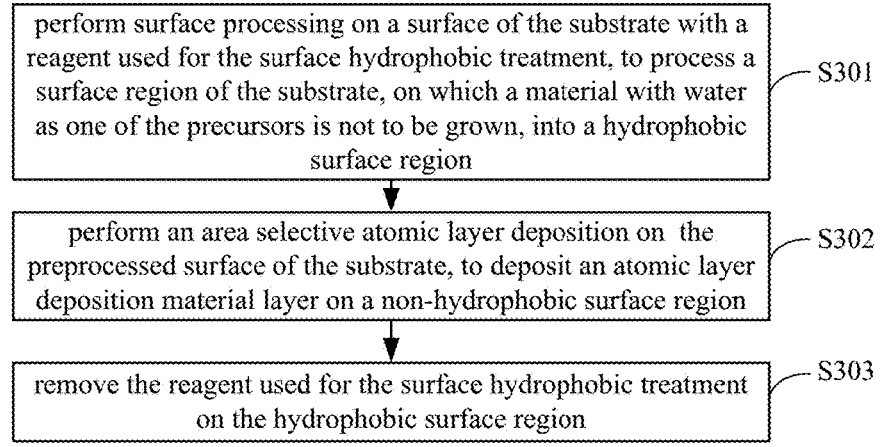
FIG. 3 is a flowchart of an area selective atomic layer deposition process according to the present disclosure.

The embodiments according to the present disclosure are described in detail in conjunction with the drawings hereinafter, so that the object, technical solutions and technical effects of the present disclosure can be understood clearly.

Before the embodiments according to the present disclosure are described, an area selective atomic layer deposition (Area Selective Atomic Layer Deposition, abbreviated as ASALD) process is introduced first.

The area selective atomic layer deposition process is a kind of atomic layer deposition process on selected surface where water is one of the precursors.

A material grown with water as one of the precursors generally grows well only on hydrophilic surfaces. In addition, the material grown with water as one of the precursors grows differently on different hydrophobic surfaces. The greater the hydrophobicity of a surface is, the higher the density of a hydrophobic material is, it is more difficult to grow the material with water as one of the precursors. The hydrophobicity of a surface is generally measured by contact angle.

Besides, for a Fabry-Pérot interferometer, in order to be compatible with a conventional CMOS process line with aspect of issues such as contamination, a bottom reflecting layer of the Fabry-Pérot interferometer is generally a Bragg stack which is a composite film layer of silicon oxide and silicon nitride. Hence, a surface of the Bragg stack in contacting with a transparent cavity layer may be processed with SC1 (a mixture of ammonium hydroxide solution, hydrogen peroxide solution and water), thereby formation of a relatively high hydrophilicity of the hydrophilic layer because of Si—OH (silanol) groups. Since Si—OH will be replaced with non-hydrophilic Si—O groups gradually in a relatively dry environment, in a case that the Bragg stack surface processed with SC1 before is re-processed with a reagent used for the surface hydrophobic treatment, the Si—O groups on the hydrophilic layer formed by Si—OH can be replaced with the hydrophobic groups, thereby forming a high density hydrophobic surface on the surface of the Bragg stack. Since it is difficult for the material grown with water as one of the precursors to grow on a hydrophobic surface, the material layer can grow only on the unprocessed hydrophilic surface not on the hydrophobic surface in the subsequent atomic layer deposition process. In the present disclosure, the stair-like transparent cavity layer is grown based on the principle. Hence, in the embodiments according to the present disclosure, a material composing the transparent cavity layer is grown by the atomic layer deposition process with water as one of the precursors.

For example, the material grown by the atomic layer deposition process with water as one of the precursors may include at least one of: $B_2O_3$, MgO, $Al_2O_3$, $SiO_2$, CaO, $Sc_2O_3$, $TiO_2$, $VO_x$, $CrO_x$, $FeO_x$, $CoO_x$, NiO, CuO, ZnO, $Ga_2O_3$, $GeO_2$, $SrO/SrCO_3$, $Y_2O_3$, $ZrO_2$, $Nb_2O_5$, $In_2O_3$, $Sb_2O_5$, $La_2O_3$, $PrO_x$, $Lu_2O_3$, $HfO_2$, $Ta_2O_5$, $WO_3$ and $BiO_x$. As an example, in a case that the material grown by using the atomic layer deposition process with water as one of the precursors is a compound, the material may be $Hf_aSi_bO_c$ etc.

Generally, in order to be compatible with the conventional CMOS BEOL process line with aspect of contamination, the material grown by using the atomic layer deposition process with water as one of the precursors may include $Al_2O_3$, $SiO_2$, $TiO_2$, $HfO_2$ and $Ta_2O_5$, typically.

For example, FIG. 3 shows an area selective atomic layer deposition process according to the present disclosure, which includes steps S301 to S303 in the following.

In step S301, a surface of a substrate is processed with a reagent used for the surface hydrophobic treatment, to process a surface region of the substrate, on which a material with water as one of the precursors is not to be grown, into a hydrophobic surface region.

Figure 4A:
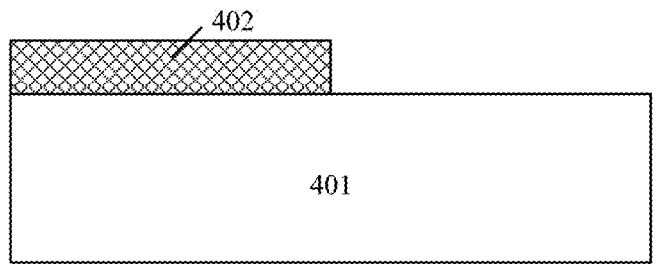
FIGS. 4A to 4C are cross section of the structures according to a series of fabrication processes of the area selective atomic layer deposition process according to an embodiment of the present disclosure.

FIG. 4A shows the cross section of the structure corresponding to step S301. Specifically, step S301 includes: performing surface processing on the surface of the substrate 401 with a reagent used for the surface hydrophobic treatment by covering part of the surface of the substrate, on which the material with water as one of the precursors is not to be grown, with a reagent used for the surface hydrophobic treatment 402. In FIG. 4A, a region covered with the reagent used for the surface hydrophobic treatment 402 is the surface region of the substrate on which the material with water as one of the precursors is not to be grown.

In a case that the substrate is a Bragg stack, before the surface of the substrate is processed with the reagent used for the surface hydrophobic treatment, a surface of the Bragg stack may be preprocessed in advance. The preprocessing may include: preprocessing the surface of the Bragg stack with SC1 (a mixture of ammonium hydroxide solution, hydrogen peroxide solution and water) to obtain a hydrophilic layer with relatively high hydrophilicity because of formation of Si—OH (silanol) layer. After the preprocessing, the preprocessed surface of the Bragg stack is processed with the reagent used for the surface hydrophobic treatment. During the hydrophobic treating process, Si—OH groups of the hydrophilic layer formed by Si—OH are being replaced with hydrophobic groups, thereby forming a high density hydrophobic surface on the surface of the Bragg stack.

In step 302, an area selective atomic layer deposition is performed on the processed surface of the substrate, to form an atomic layer deposition material layer on a non-hydrophobic surface region.

Figure 4B:
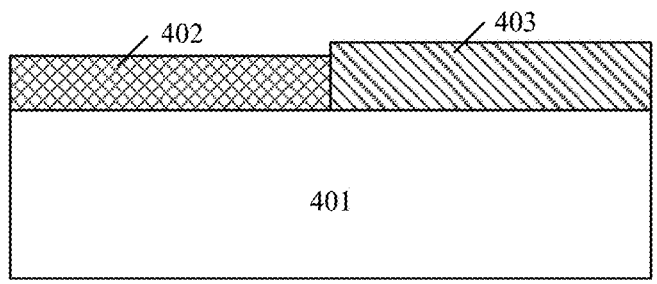

FIG. 4B shows the cross section of the structure corresponding to step S302. In performing the area selective atomic layer deposition on the processed surface of the substrate, a deposited material can be grown only on part of the surface of the substrate covered without the reagent used for the surface hydrophobic treatment 402, and no material can be grown on the surface covered with the reagent used for the surface hydrophobic treatment 402. In this way, after step S302 is performed, an atomic layer deposition material layer 403 is formed on the non-hydrophobic surface region of the substrate 401.

In step S303, the reagent used for the surface hydrophobic treatment on the hydrophobic surface region is removed.

Figure 4C:
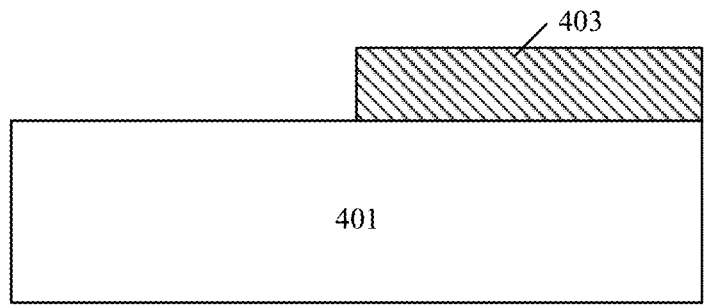

The reagent used for the surface hydrophobic treatment covered on the surface of the substrate is removed with an appropriate method based on the characteristic of the reagent used for the surface hydrophobic treatment, i.e., removing the reagent used for the surface hydrophobic treatment on the hydrophobic surface region. FIG. 4C shows the corresponding cross sectional diagram after step S303 is completed.

In the embodiment of the present disclosure, the reagent used for the surface hydrophobic treatment may be a surface passivator or a patternable polymer. The patternable polymer may be polymethyl methacrylate (PMMA). In some specific embodiments of the present disclosure, step S301 may be performed through the following two implementations depending on different reagents used for the surface hydrophobic treatment.

Figure 5:
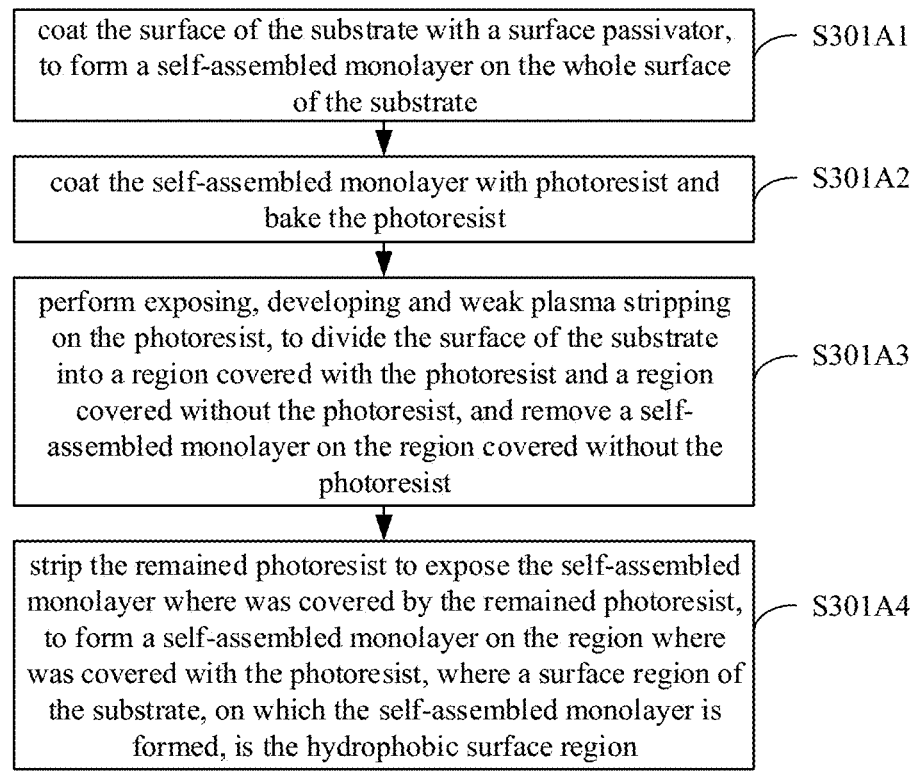
FIG. 5 is a flowchart of a specific implementation of step S301 in a case that a reagent used for the surface hydrophobic treatment is the surface passivator, according to an embodiment of the present disclosure.

First Implementation:

FIG. 5 is a flowchart of a specific implementation of step S301 in a case that a reagent used for the surface hydrophobic treatment is the surface passivator. As shown in FIG. 5, the specific implementation includes steps S301A1 to S301A4 in the following.

In step S301A1, the surface of the substrate is coated with a surface passivator to form a self-assembled monolayer (Self-Assembled Monolayer, abbreviated as SAM) on the whole surface of the substrate.

For example, the surface of the substrate may be coated with the surface passivator by spraying. In another embodiment of the present disclosure, in order to form the self-assembled monolayer on the whole surface of the substrate, the substrate may be soaked in the surface passivator, which is generally applied in laboratories.

Figure 6A:
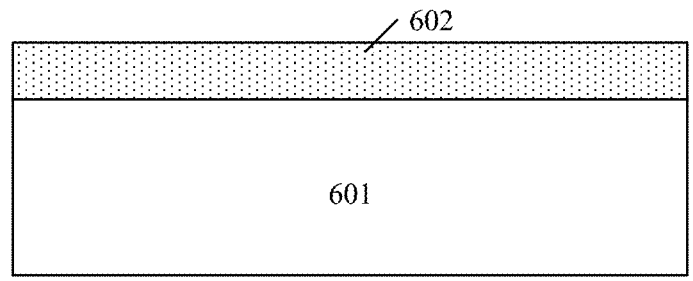
FIGS. 6A to 6D are cross section of the structures according to a series of fabrication processes of a specific implementation of step S301 in a case that a reagent used for the surface hydrophobic treatment is the surface passivator, according to an embodiment of the present disclosure.

FIG. 6A shows a cross section of the structure corresponding to step S301A1. In FIG. 6A, 601 represents the substrate, and 602 represents the self-assembled monolayer formed with the surface passivator.

In step S301A2, the self-assembled monolayer is coated with photoresist and the photoresist is baked.

For example, the self-assembled monolayer may be coated with the photoresist by spin-coating in the present disclosure. Then, the photoresist on the self-assembled monolayer is baked, to evaporate the organic solvent in the photoresist.

Figure 6B:
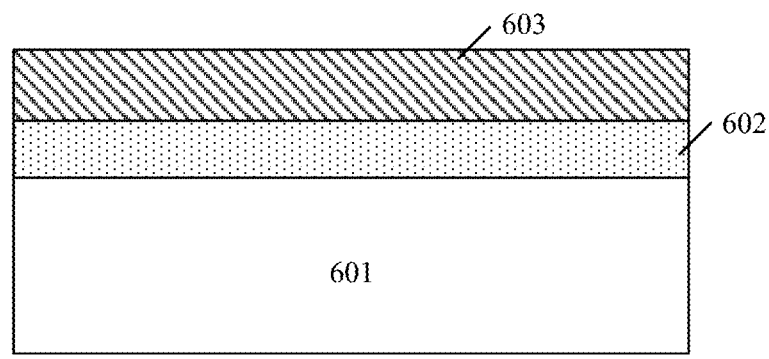

FIG. 6B shows a cross section of the structure corresponding to step S301A2. In FIG. 6B, 603 represents the photoresist on the self-assembled monolayer 602.

In step S301A3, exposing, developing and weak plasma stripping are performed on the photoresist, to divide the surface of the substrate into a region covered with the photoresist and a region covered without the photoresist, and then the self-assembled monolayer on the region covered without the photoresist is removed.

Specifically, the photoresist 603 is exposed by using a mask with a preset pattern, to transfer the pattern of the mask to the photoresist and then developed, and a soluble region of the photoresist, which is formed by the exposing, is dissolved with a chemical developer, to remove the region of the photoresist which can be dissolved by the developer, thereby dividing the surface of the substrate 601 into the region covered with the photoresist and the region covered without the photoresist. The region covered without the photoresist is coated with the self-assembled monolayer.

Figure 6C:
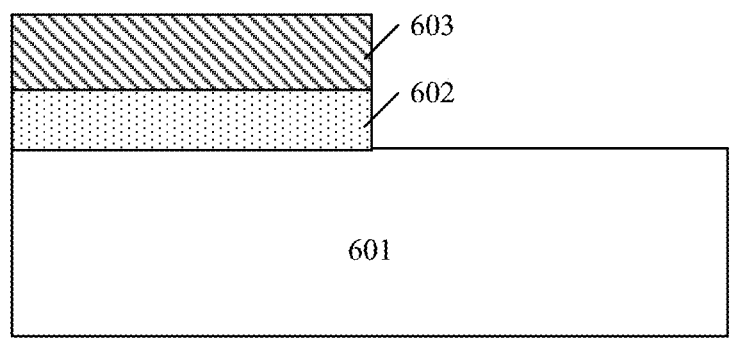

After the developing is performed, the self-assembled monolayer on the region covered without the photoresist needs to be removed. FIG. 6C shows the corresponding cross section of the structures after step S301A3 is completed.

For example, a self-assembled monolayer composed of some surface passivation layers may be removed with developers, for example, a self-assembled monolayer composed of hexamethyldisilazane (HMDS). In a case of other passivation layers, the self-assembled monolayer may be oxidized and removed by using a weak plasma stripping process with most of the photoresist remained.

In step S301A4, the remained photoresist is stripped, to expose the self-assembled monolayer where was covered by the remained photoresist, thereby forming the self-assembled monolayer on the region where was covered with the photoresist, where a surface region of the substrate, on which the self-assembled monolayer is formed, is the hydrophobic surface region.

Since photoresists can be dissolved by organic solvents, the remained photoresist may be stripped by dissolving with organic solvents, such as acetone.

Figure 6D:
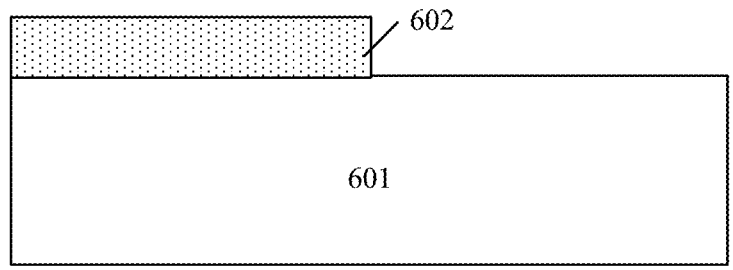

As the organic solvent does not destroy the self-assembled monolayer, the self-assembled monolayer covered by the photoresist is exposed after the photoresist is stripped, thereby forming the self-assembled monolayer on the region where was covered with the photoresist. The surface region of the substrate, on which the self-assembled monolayer is formed, is hydrophobic. FIG. 6D shows the corresponding cross section of the structure after step S301A4 is completed.

It should be noted, in case that a reagent used for the surface hydrophobic treatment is the surface passivator, as shown in step S303, the reagent used for the surface hydrophobic treatment on the hydrophobic surface region, i.e., the surface passivator, may be removed by plasma ashing.

In the embodiment of the present disclosure, the surface passivator may include any of the following compounds:

ODTS, octadecyltrichlorosilane;
HMDS, hexamethyl disilazane;
ODTM, octadecyltrimethoxysilane;
ODTE, octadecyltriethoxysilane; and
FOTS, tridecafluoro-1,1,2,2-Tetrahydrooctyltrichlorosilane.

Figure 7:
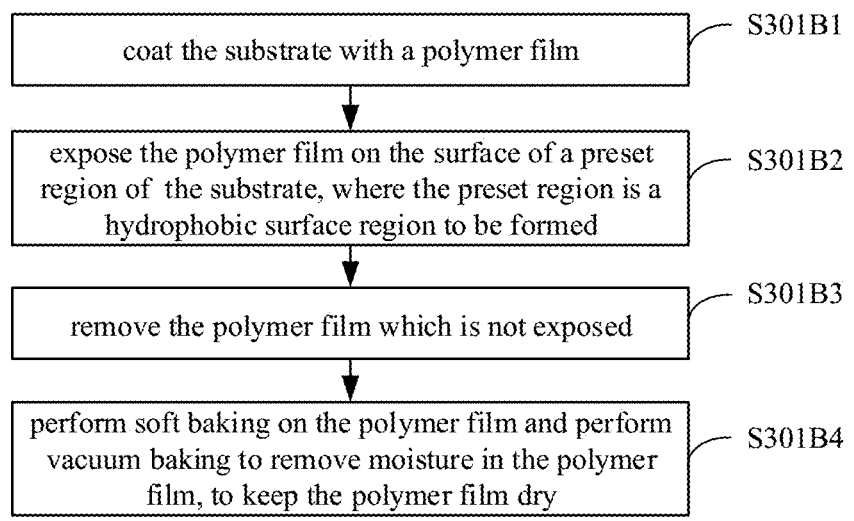
FIG. 7 is a flowchart showing a series of fabrication processes of a specific implementation of step S301 in a case that the reagent used for the surface hydrophobic treatment is a kind of polymer, according to an embodiment of the present disclosure.

Second Implementation:

FIG. 7 shows a flowchart of the specific implementation of step S301 in case that the reagent used for the surface hydrophobic treatment is a patternable polymer. As shown in FIG. 7, the specific implementation includes from steps S301B1 to S301B4.

In step S301B1, the substrate is coated with a polymer film.

Figure 8A:
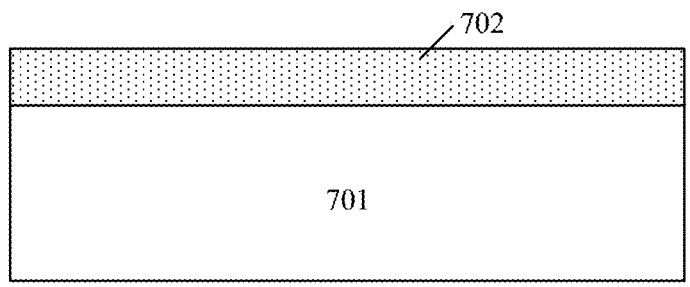
FIGS. 8A and 8B are cross section of the structures according to a series of fabrication processes of a specific implementation of step S301 in a case that the reagent used for the surface hydrophobic treatment is a kind of polymer, according to an embodiment of the present disclosure.

For example, the substrate 701 may be coated with a polymer film 702 by spin-coating. FIG. 8A shows the corresponding cross section of the structure after step S301B1 is completed.

In a specific example, the polymer film may be made of a polymer dissolved in toluene. A mass fraction of the polymer in the toluene solution may be 1-5 wt. %.

In step 301B2, the polymer film on the surface of a preset region of the substrate is exposed, where the preset region is the hydrophobic surface region to be formed.

Step S301B2 may include exposing the polymer film 702 on the surface of the preset region of the substrate by using a mask with a preset pattern, where the preset region is the hydrophobic surface region to be formed.

For example, the polymer film 702 may be exposed in a deep ultra violet environment (the wavelength is 248 nm).

In step S301B3, the polymer film which is not exposed is removed.

Figure 8B:
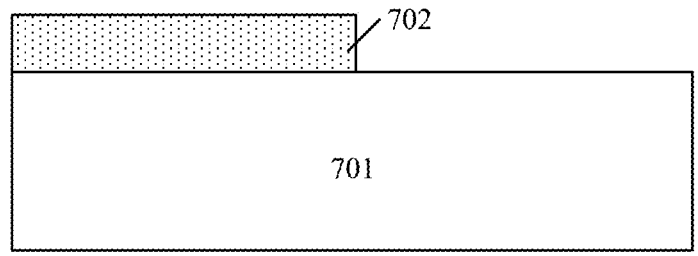

It should be noted that the exposed polymer film can not be removed. FIG. 8B shows the corresponding cross section of the structure after step S301B3 is completed.

In a specific embodiment, the unexposed polymer film may be removed with a mixed solution of isopropyl alcohol and methyl isobutyl ketone, where a volume ratio of the isopropyl alcohol and the methyl isobutyl ketone may be 1:1.

In step S301B4, soft baking is performed on the polymer film, afterwards vacuum baking is performed to remove moisture in the polymer film, to keep the polymer film dry.

A specific process condition of step S301B4 may perform soft baking on the polymer film for 5 minutes at 120 degrees Celsius, a temperature of the vacuum baking may be 100 degrees Celsius and a duration of the vacuum baking may be two hours.

In the embodiment of the present disclosure, the patternable polymer may be polymethyl methacrylate which is abbreviated as PMMA.

It should be noted, in case that the reagent used for the surface hydrophobic treatment is a kind of polymer, in step S303, the reagent used for the surface hydrophobic treatment on the hydrophobic surface region, i.e., the polymer, may be removed by plasma ashing or dissolving with organic solvents, for example acetone.

The above-described is specific implementations of the area selective atomic layer deposition process used in the embodiment of the present disclosure.

For a method for monolithic integration of a hyperspectral image sensor according to an embodiment of the present disclosure, the substrate described above is a CMOS image sensor wafer with a size of 12 inches or below.

Some specific implementations of the method for monolithic integration of a hyperspectral image sensor according to the present disclosure are described hereinafter in detail in conjunction with the drawings and the area selective atomic layer deposition process described above.

Figure 9:
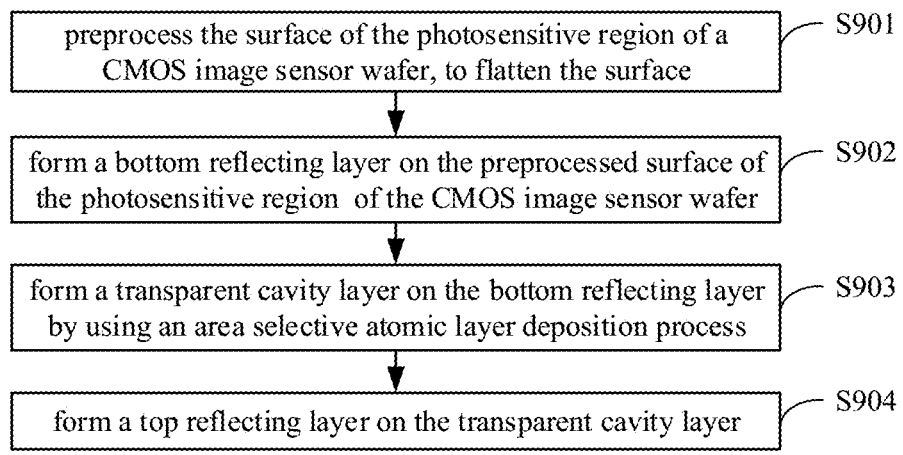
FIG. 9 is a flowchart of a method for fabrication of a hyperspectral imager according to an embodiment of the present disclosure.

FIG. 9 is the flowchart of a method for monolithic integration of a hyperspectral image sensor according to an embodiment of the present disclosure. As shown in FIG. 9, the method includes from steps S901 to S904.

In step S901, the surface of the photosensitive region of a CMOS image sensor wafer is preprocessed, to flatten the surface of the photosensitive region.

Figure 10A:
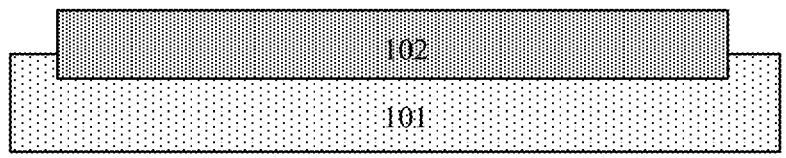
FIGS. 10A to 10D are cross section of the structures according to a series of fabrication processes of a method for monolithic integration of a hyperspectral image sensor according to an embodiment of the present disclosure.

FIG. 10A shows the cross section of the structure corresponding to step S901. Step S901 includes: flattening a whole CMOS image sensor wafer 101 (including the surface of the photosensitive region 102) by using a chemical mechanical polishing (CMP) process, to make the surface of the photosensitive region flat.

In step S902, a bottom reflecting layer is formed on the preprocessed surface of the photosensitive region of the CMOS image sensor wafer.

Figure 10B:
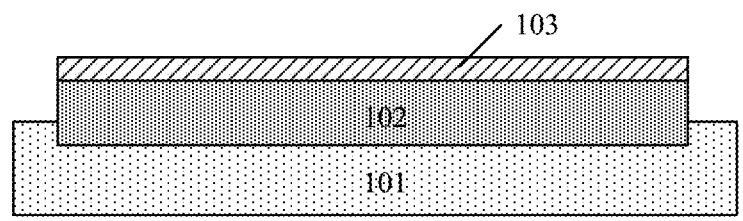

FIG. 10B shows the cross section of the structure corresponding to step S902. As shown in FIG. 10B, a bottom reflecting layer 103 is formed on the surface of the photosensitive region 102 of the CMOS image sensor wafer. The bottom reflecting layer 103 is a bottom reflecting layer of a Fabry-Pérot interferometer to be formed. The bottom reflecting layer 103 has high reflectivity.

In step S903, a transparent cavity layer is formed on the bottom reflecting layer by using the area selective atomic layer deposition process.

Figure 10C:
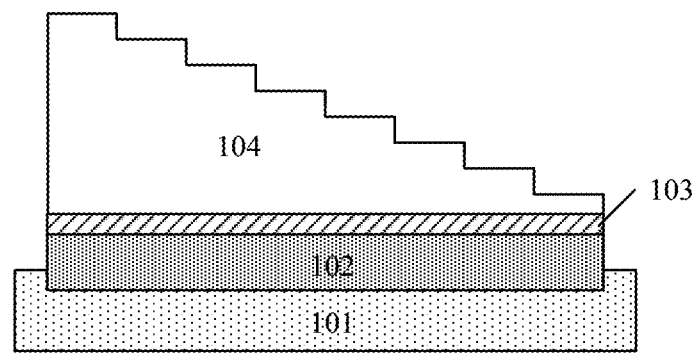

FIG. 10C shows a cross section of the structure corresponding to step S903. For example, a transparent cavity layer 104 formed is composed of eight step heights structures. Practically, in the embodiment of the present disclosure, the transparent cavity layer 104 formed is not limited to be composed of eight step heights structures, and may be composed of N step heights structures where, $N=2^m$, $m \geq 1$, and m is a positive integer.

In the embodiment of the present disclosure, the transparent cavity layer 104 is a space in which light can be reflected between two reflective layers with high reflectivity. In the transparent cavity layer, each step height structure corresponds to a spectral band of one wavelength range, hence one spectrum containing multiple wavelengths can be divided into spectral bands of the multiple wavelengths by each step height structure, thereby to realize accurate data analyzing for respective spectral bands.

In the embodiment of the present disclosure, N step heights structures can be formed on the bottom reflecting layer by using the area selective atomic layer deposition process for $\log_2^{N+1}=m+1$ times, where the N step structures form the transparent cavity layer. The specific implementation is described in detail hereinafter in conjunction with FIGS. 11 to 14J.

In the embodiment of the present disclosure, the N step heights structures may be formed on the bottom reflecting layer by using the area selective atomic layers deposition process for $\log_2^{N+1}=m+1$ times through two specific implementations.

First Specific Implementation

For example, it is set N=8. That is, the transparent cavity layer is composed of eight step heights structures. In a case that N=8, the area selective atomic layer deposition process needs to be performed for $\log_2^8+1=3+1=4$ times. In this case, m=3.

Figure 11:
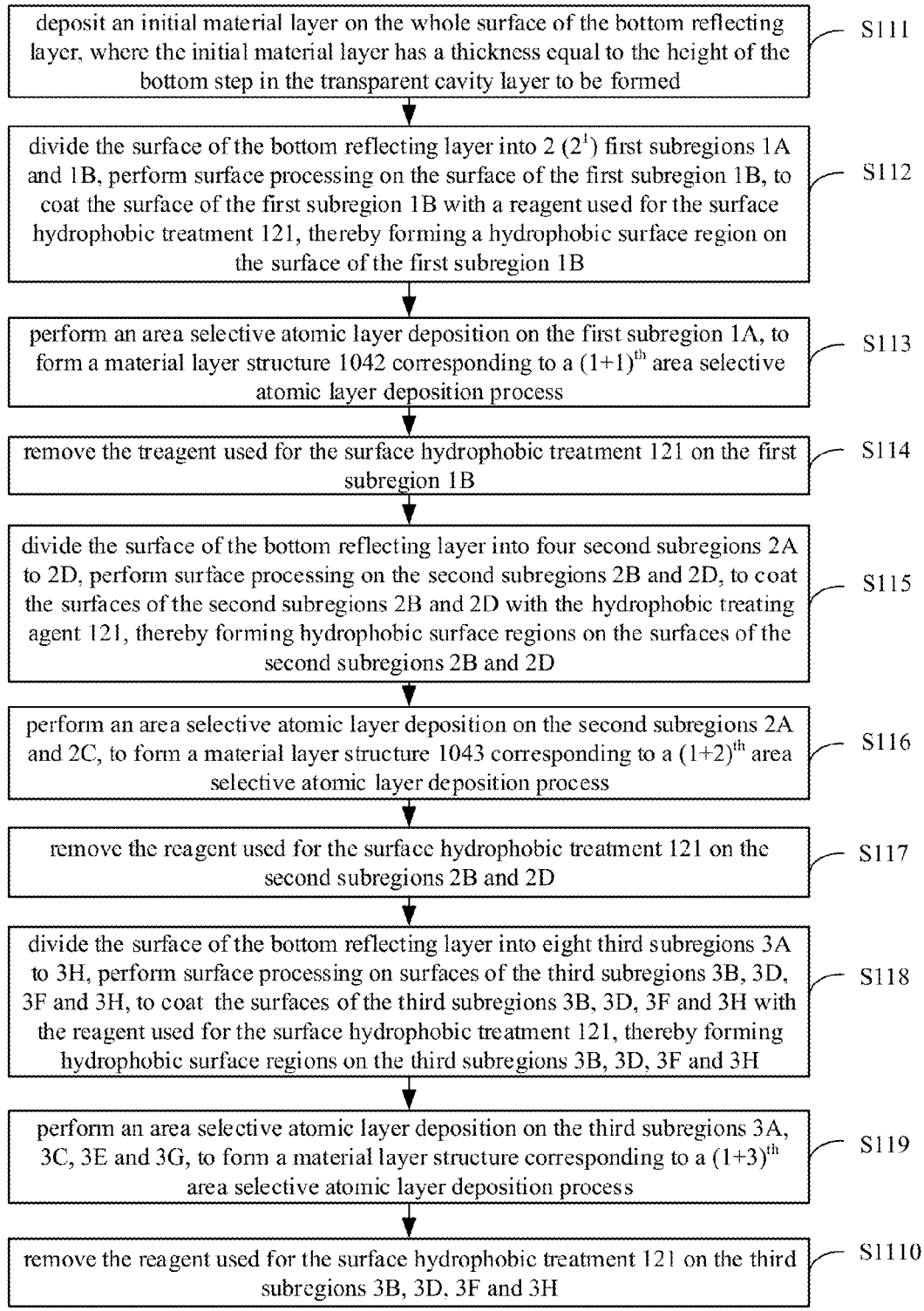
FIG. 11 is a flowchart of a first specific implementation of step S903 according to an embodiment of the present disclosure.

FIG. 11 shows the flowchart of the first specific implementation, which includes steps from S111 to S1110.

In step S111, an initial material layer is deposited on the whole surface of the bottom reflecting layer, where the initial material layer has a thickness equal to the height of the bottom step of a transparent cavity layer to be formed.

Figure 12A:
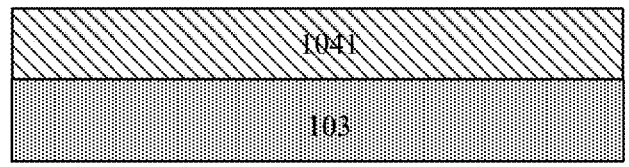
FIGS. 12A to 12J are cross section of the structures according to a series of fabrication processes in the first specific implementation of step S903 according to an embodiment of the present disclosure.

As shown in FIG. 12A, step S111 includes: depositing an initial material layer 1041 on the whole surface of the bottom reflecting layer 103 by using the ASALD process, where the initial material layer 1041 has a thickness equal to the height of the bottom step of the transparent cavity layer to be formed.

In step S111, the first area selective atomic layer deposition process for forming the transparent cavity layer is performed.

In step S112, the surface of the bottom reflecting layer is divided equally into 2 ($2^1$) first subregions 1A and 1B, and surface processing is performed on the surface of the first subregion 1B, to coat the surface of the first subregion 1B with a reagent used for the surface hydrophobic treatment 121, thereby forming a hydrophobic surface region on the surface of the first subregion 1B.

Figure 12B:
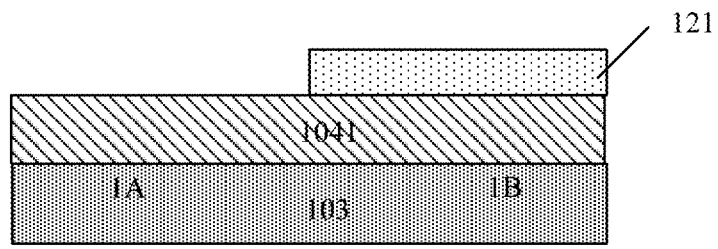

It should be noted that a reference may be made to related descriptions in step S301 for specific implementation to perform surface processing on the surface of the first subregion 1B, to coat the surface of the first subregion 1B with the reagent used for the surface hydrophobic treatment 121, thereby forming the hydrophobic surface region on the surface of the first subregion 1B. FIG. 12B shows a cross section of the structure corresponding to step S112.

In step S113, an area selective atomic layer deposition is performed on the first subregion 1A, to form a material layer structure 1042 corresponding to a $(1+1)^{th}$ area selective atomic layer deposition process.

Figure 12C:
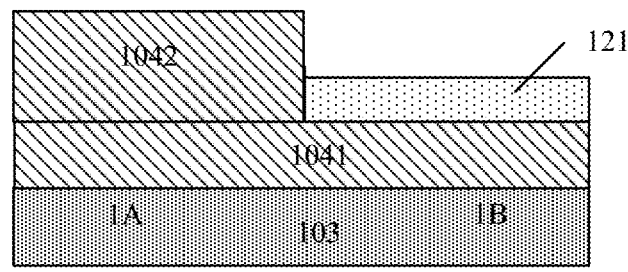

The material layer structure 1042 grown through the $(1+1)^{th}$ area selective atomic layer deposition process has a thickness equal to a height of 4 ($2^{(3-1)}$) common steps. FIG. 12C shows a cross section of the structure corresponding to step S113. A height of a common step is a height of a single step in the transparent cavity layer to be formed except the bottom step.

In step S114, the reagent used for the surface hydrophobic treatment 121 on the first subregion 1B is removed.

Figure 12D:
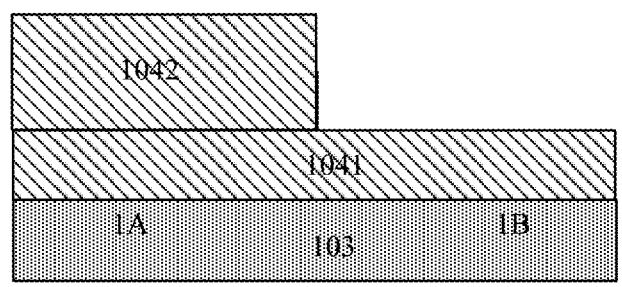

FIG. 12D shows a cross section of the structure corresponding to step S114.

From step S112 to step S114, the second area selective atomic layer deposition process is performed. Hereinafter a third area selective atomic layer deposition process is performed.

In step S115, the surface of the bottom reflecting layer is divided equally into 4 ($2^2$) second subregions 2A to 2D, and surface processing is performed on surfaces of the second subregions 2B and 2D, to coat the surface of the second subregions 2B and 2D with the hydrophobic treatment agent 121, thereby forming hydrophobic surface regions on the surfaces of the second subregions 2B and 2D.

Figure 12E:
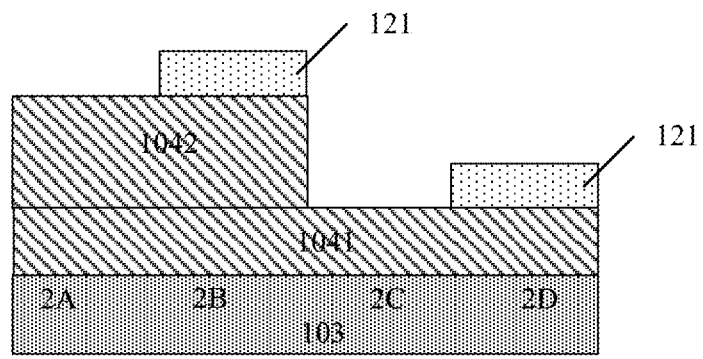

Practically, step S115 may be understood as follows: dividing each first subregion equally into two second subregions, and forming a hydrophobic surface region on a surface of a second subregion every another second subregion. FIG. 12E shows a cross section of the structure corresponding to step S115.

In step S116, an area selective atomic layer deposition is performed on the second subregions 2A and 2C, to form a material layer structure 1043 corresponding to a $(1+2)^{th}$ area selective atomic layer deposition process.

Figure 12F:
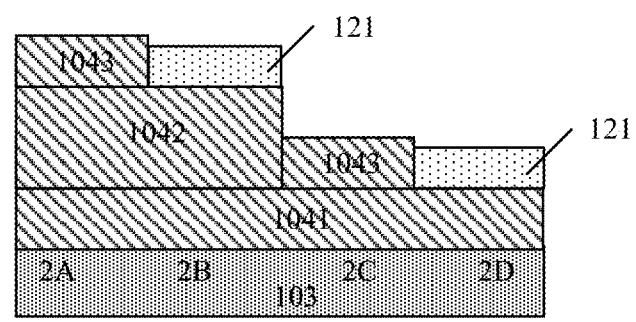

The material layer structure 1043 grown through the $(1+2)^{th}$ area selective atomic layer deposition process has a thickness equal to a height of 2 ($2^{(3-2)}$) common steps. FIG. 12F shows a cross section of the structure corresponding to step S116.

In step S117, the reagent used for the surface hydrophobic treatment 121 on the second subregions 2B and 2D is removed.

Figure 12G:
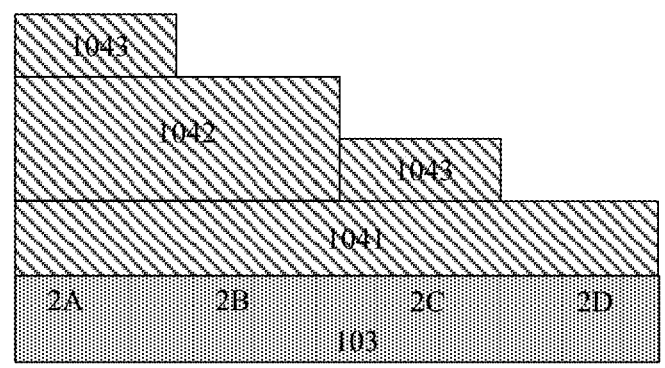

FIG. 12G shows a cross section of the structure corresponding to step S117.

From step S115 to step S117, the third area selective atomic layer deposition process is performed. Hereinafter a fourth area selective atomic layer deposition process is performed.

In step S118, the surface of the bottom reflecting layer is divided equally into 8($2^3$) third subregions 3A to 3H, and surface processing is performed on surfaces of the third subregions 3B, 3D, 3F and 3H, to coat the surfaces of the third subregions 3B, 3D, 3F and 3H with the reagent used for the surface hydrophobic treatment 121, thereby forming hydrophobic surface regions on the surfaces of the third subregions 3B, 3D, 3F and 3H.

Figure 12H:
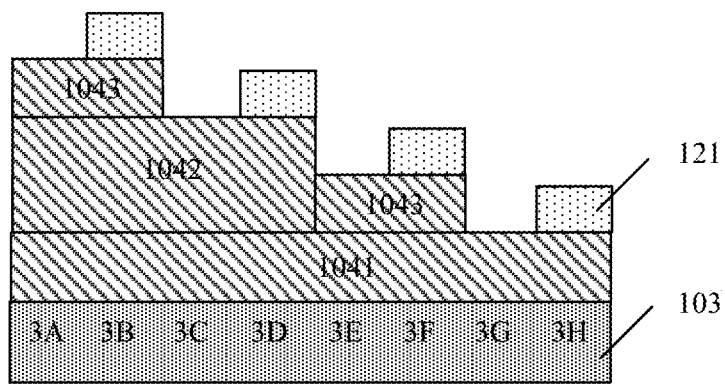

Practically, step S118 may be understood as follows: dividing each second subregion equally into two third subregions, and forming a hydrophobic surface region on a surface of a third subregion every another third subregion. FIG. 12H shows a cross section of the structure corresponding to step S118.

In step S119, an area selective atomic layer deposition is performed on the third subregions 3A, 3C, 3E and 3G to form a material layer structure corresponding to the $(1+3)^{th}$ area selective atomic layer deposition process.

Figure 12I:
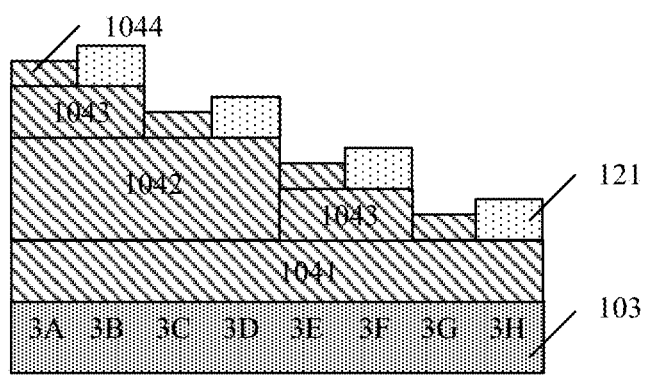

The material layer structure 1044 grown through the $(1+3)^{th}$ area selective atomic layer deposition process has a thickness equal to a height of $1(2^{(3-3)})$ common step. FIG. 12I shows a cross section of the structure corresponding to step S119.

In step S1110, the reagent used for the surface hydrophobic treatment 121 on the third subregions 3B, 3D, 3F and 3H is removed.

Figure 12J:
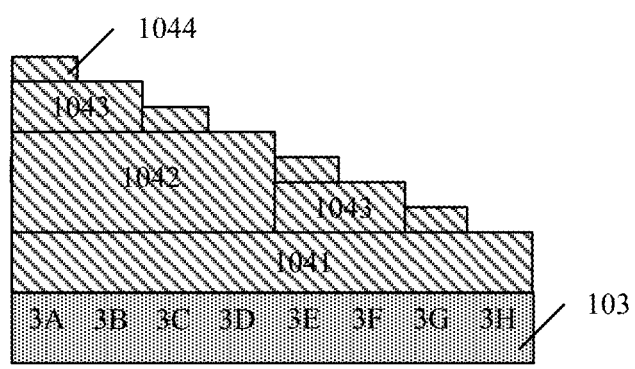

FIG. 12J shows a cross section of the structure corresponding to step S1110.

From step S118 to step S1110, the fourth area selective atomic layer deposition process is performed.

The above-described is an example of the first specific implementation of step S903 in a case that N=8. Practically, in the embodiment of the present disclosure, the number N of step structures in the transparent cavity layer may be $2^m$, where m is a positive integer.

In a case that the number of step structures in the transparent cavity layer is N=$2^m$, the first specific implementation may be summarized as follows based on the example in which N=8.

The forming N step structures on the bottom reflecting layer by using the area selective atomic layer deposition process for (m+1) times includes: performing a first area selective atomic layer deposition process and performing a $(1+i)^{th}$ area selective atomic layer deposition process, where i∈{1, m}, and i is an integer.

The first area selective atomic layer deposition process includes:

depositing an initial material layer on a whole surface of the bottom reflecting layer, where the initial material layer has a thickness equal to the height of a bottom step of a transparent cavity layer to be formed.

The $(1+i)^{th}$ area selective atomic layer deposition process includes:

dividing the surface of the bottom reflecting layer equally into $2^i$ $i^{th}$ subregions; and performing an area selective atomic layer deposition on an $i^{th}$ subregion every the other $i^{th}$ subregions, to form a material layer structure corresponding to the $i^{th}$ area selective atomic layer deposition process.

The material layer structure grown through the $i^{th}$ area selective atomic layer deposition process has a thickness equal to a height of $2^{(m-i)}$ common steps, and a height of a common step is a height of a single step in the transparent cavity layer to be formed except the bottom step.

Second Specific Implementation

For example, it is set N=8. That is, the transparent cavity layer is composed of eight step structures. In a case that N=8, the area selective atomic layer deposition process needs to be performed for $\log_2^8+1=3+1=4$ times. In this case, m=3.

Figure 13:
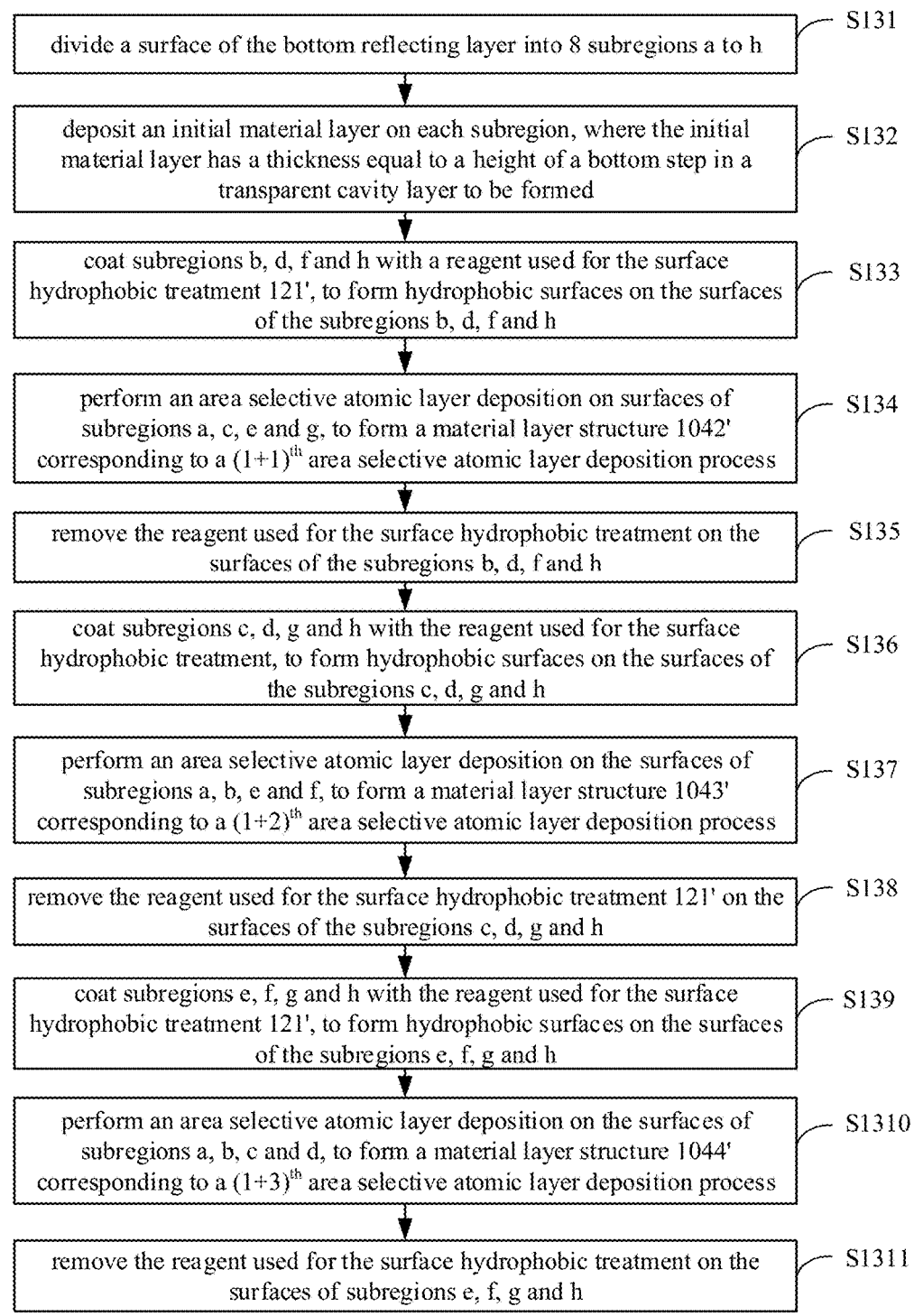
FIG. 13 is a flowchart of a second specific implementation of step S903 according to an embodiment of the present disclosure.

FIG. 13 shows a flowchart of the second specific implementation, which includes from steps S131 to S1311.

In step S131, a surface of the bottom reflecting layer is equally divided into 8 ($2^3$) subregions a to h.

Figure 14A:
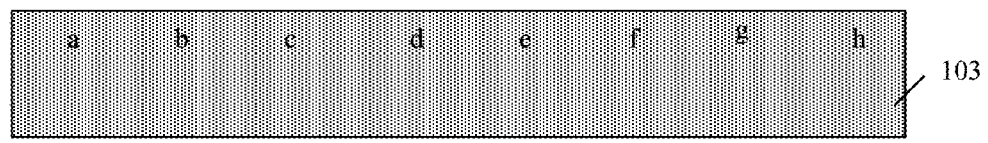
FIGS. 14A to 14K are cross section of the structures according to a series of fabrication processes in the second specific implementation of step S903 according to an embodiment of the present disclosure.

FIG. 14A shows a corresponding cross section of the structure after step S131 is completed.

In step S132, an initial material layer is deposited on each subregion, where the initial material layer has a thickness equal to the height of a bottom step in a transparent cavity layer to be formed.

Figure 14B:
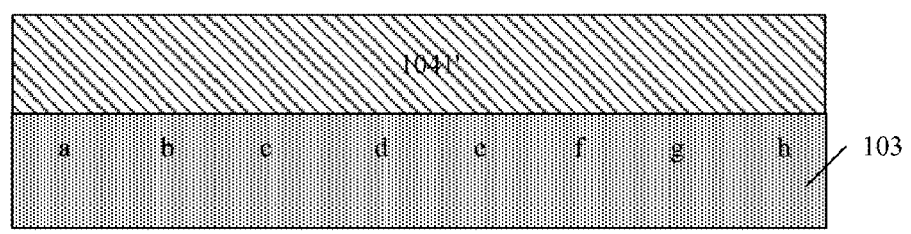

As shown in FIG. 14B, step S132 includes: depositing an initial material layer 1041' on a whole surface of the bottom reflecting layer 103 by using the ASALD process, where the initial material layer 1041' has a thickness equal to the height of the bottom step in the transparent cavity layer to be formed.

In step S132, the first area selective atomic layer deposition process is performed to form the transparent cavity layer.

In step S133, surfaces of subregions b, d, f and h are coated with a reagent used for the surface hydrophobic treatment 121', to form hydrophobic surfaces on the surfaces of the subregions b, d, f and h.

Figure 14C:
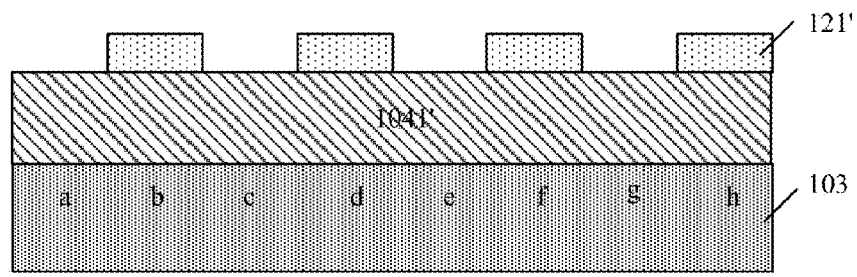

Step S113 may be understood as follows: coating a surface of $1(2^{(1-1)})$ subregion with the reagent used for the surface hydrophobic treatment every other $1(2^{(1-1)})$ subregion, to form a hydrophobic surface every other subregion. FIG. 14C shows a corresponding cross section of the structure after step S113 is completed.

In step S134, an area selective atomic layer deposition is performed on surfaces of subregions a, c, e and g, to form a material layer structure 1042' corresponding to a $(1+1)^{th}$ area selective atomic layer deposition process.

Figure 14D:
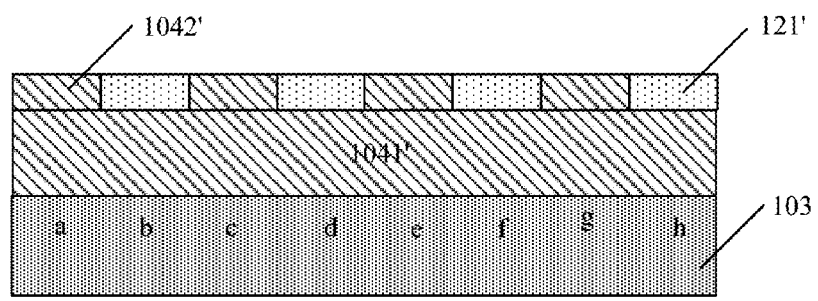

Step S134 may be understood as follows: performing the area selective atomic layer deposition performed on $1(2^{(1-1)})$ subregion every other $1(2^{(1-1)})$ subregion, to form the material layer structure 1042' corresponding to the $(1+1=2)^{th}$ area selective atomic layer deposition process. The material layer structure grown through the second area selective atomic layer deposition process has a thickness equal to a height of $1(2^{(1-1)})$ common step. FIG. 14D shows the corresponding cross section of the structure after step S134 is completed.

In step S135, the reagent used for the surface hydrophobic treatment on the surfaces of the subregions b, d, f and h is removed.

Figure 14E:
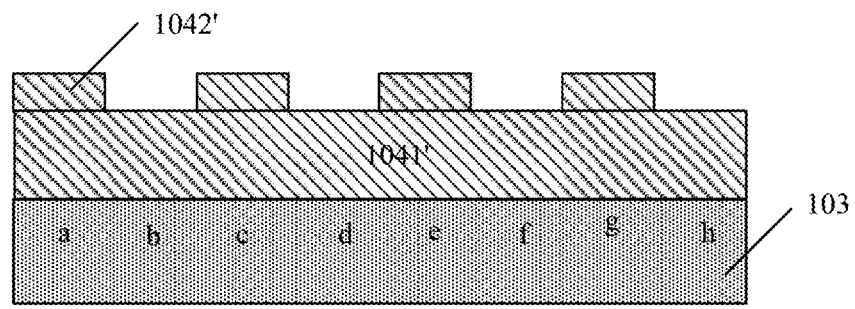

FIG. 14E shows the corresponding cross section of the structure after step S135 is completed.

From step S133 to step S135, the second area selective atomic layer deposition process of the second specific implementation is performed. Hereinafter a third area selective atomic layer deposition process is performed.

In step S136, subregions c, d, g and h are coated with the reagent used for the surface hydrophobic treatment 121', to form hydrophobic surfaces on the surfaces of the subregions c, d, g and h.

Step S136 may be understood as follows: coating surfaces of 2 ($2^{(2-1)}$) subregions with the reagent used for the surface hydrophobic treatment every other 2 ($2^{(2-1)}$) subregions, to form hydrophobic surfaces every other 2 subregions.

Figure 14F:
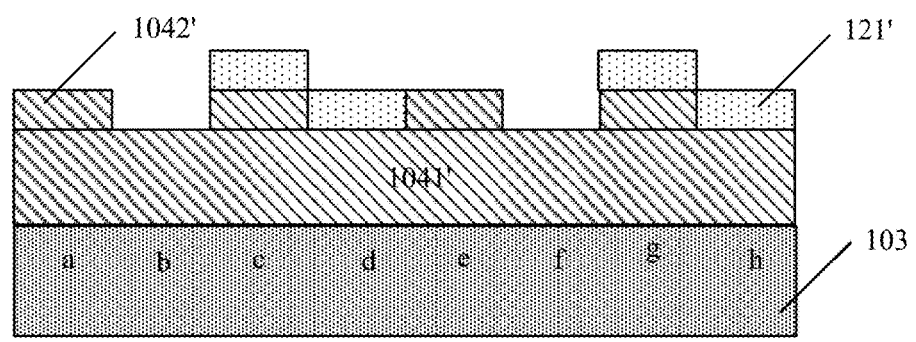

FIG. 14F shows the corresponding cross section of the structure after step S136 is completed.

In step S137, an area selective atomic layer deposition is performed on the surfaces of subregions a, b, e and f, to form a material layer structure 1043' corresponding to a $(1+2)^{th}$ area selective atomic layer deposition process.

Step S137 may be understood as follows: perform the area selective atomic layer deposition is performed on $2(2^{(2-1)})$ subregions every other $2(2^{(2-1)})$ subregions, to form the material layer structure corresponding to the third area selective atomic layer deposition process. The material layer structure grown through the third area selective atomic layer deposition process has a thickness equal to a height of $2(2^{(2-1)})$ common steps.

Figure 14G:
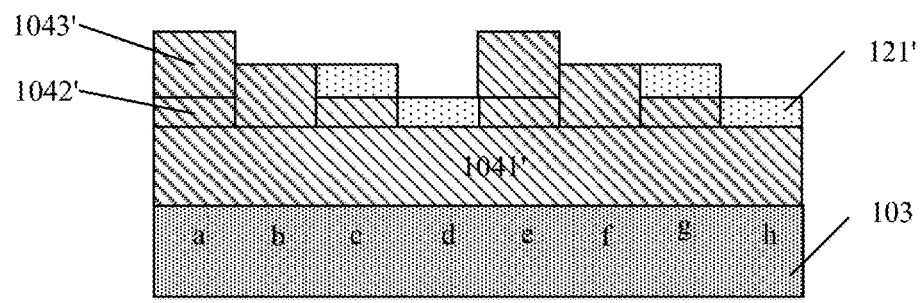

FIG. 14G shows the corresponding cross section of the structure after step S137 is completed.

In step S138, the reagent used for the surface hydrophobic treatment 121' on the surfaces of the subregions c, d, g and h is removed.

Figure 14H:
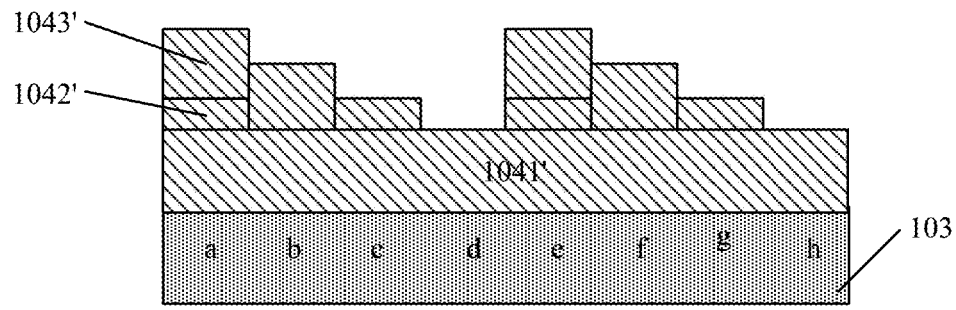

FIG. 14H shows the corresponding cross section of the structure after step S138 is completed.

From step S136 to step S138, the third area selective atomic layer deposition process of the second specific implementation is performed. Hereinafter a fourth area selective atomic layer deposition process is performed.

In step S139, subregions e, f, g and h are coated with the reagent used for the surface hydrophobic treatment 121', to form hydrophobic surfaces on the surfaces of the subregions e, f, g and h.

Step S139 may be understood as follows: coating surfaces of 4 ($2^{(3-1)}$) subregions with the reagent used for the surface hydrophobic treatment every other 4 ($2^{(3-1)}$) subregions, to form hydrophobic surfaces every the other four subregions.

Figure 14I:
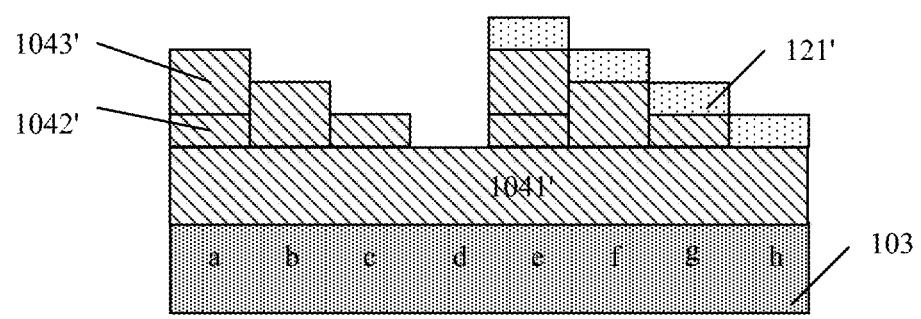

FIG. 14I shows the corresponding cross section of the structure after step S139 is completed.

In step S1310, an area selective atomic layer deposition is performed on the surfaces of subregions a, b, c and d, to form a material layer structure 1044' corresponding to a $(1+_3)^{th}$ area selective atomic layer deposition process.

Step S1310 may be understood as follows: perform the area selective atomic layer deposition on surfaces of 4 ($2^{(3-1)}$) subregions every other 4 ($2^{(3-1)}$) subregions, to form the material layer structure 1044' corresponding to the fourth area selective atomic layer deposition process. The material layer structure grown through the fourth area selective atomic layer deposition process has a thickness equal to a height of 4 ($2^{(3-1)}$) steps.

Figure 14J:
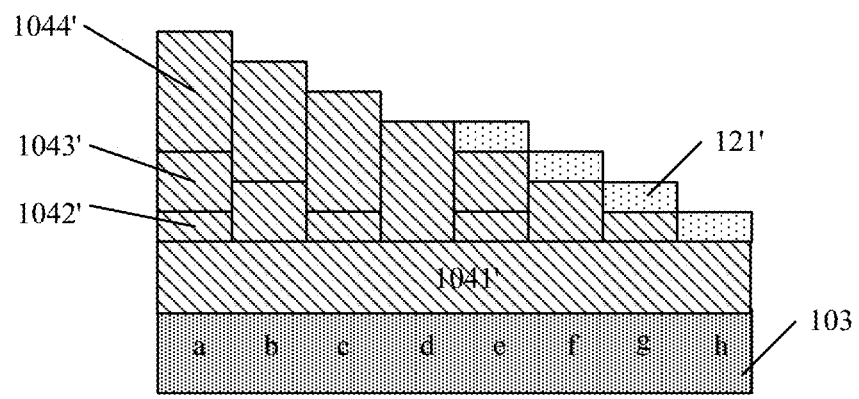

FIG. 14J shows the corresponding cross section of the structure after step S1310 is completed.

In step S1311, the reagent used for the surface hydrophobic treatment 121' on the surfaces of subregions e, f, g and h is removed.

Figure 14K:
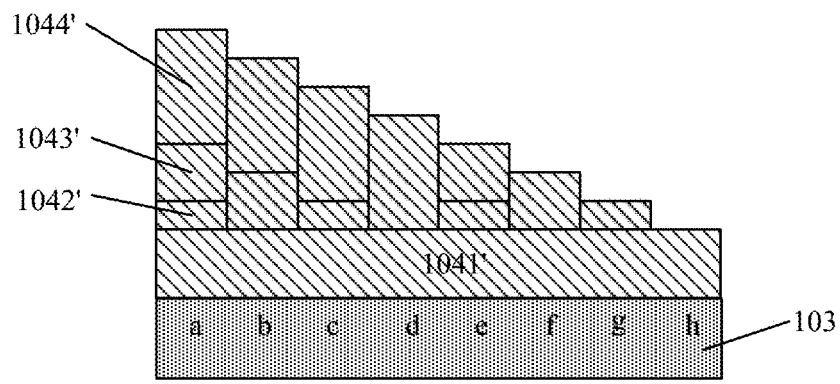

FIG. 14K shows the corresponding cross section of the structure after S1311 is completed.

From step S139 to step S1311, the fourth area selective atomic layer deposition process of the second specific implementation is performed.

The above-described is an example of the second specific implementation of step S903 in a case that N=8. Practically, in the embodiment of the present disclosure, the number of step structures in the transparent cavity layer may be $2^m$, where m is a positive integer.

In a case that the number of step structures in the transparent cavity layer is $N=2^m$, the second specific implementation above may be summarized as follows based on the example in which N=8.

A surface of the bottom reflecting layer is divided equally into N subregions.

A first area selective atomic layer deposition process includes:

depositing an initial material layer on each subregion, where the initial material layer has a thickness equal to the height of a bottom step in the transparent cavity layer to be formed.

A $(1+i)^{th}$ area selective atomic layer deposition process includes:

performing an area selective atomic layer deposition on $2^{(i-1)}$ subregions every the other $2^{(i-1)}$ subregions, to form a material layer structure corresponding to the $i^{th}$ area selective atomic layer deposition process.

The material layer structure grown through the $i^{th}$ area selective atomic layer deposition process has a thickness equal to a height of $2^{(i-1)}$ common steps. A height of a common step is the height of a single step in the transparent cavity layer to be formed except a bottom step; and i∈{1, m} and i is an integer.

Through the first and second specific implementations of step S903, N step structures can be formed on the bottom reflecting layer through less area selective atomic layer deposition processes. It should be noted that in the embodiment of the present disclosure, step S903 is not limited to the two specific implementations above. For example, in the present disclosure, one step structure may be formed through each area selective atomic layer deposition process. In this way, more area selective atomic layer deposition processes are used and more corresponding masks are fabricated, thereby resulting increasing in cost, tolerances while decreasing in efficiency.

It should be noted that the first specific implementation and the second specific implementation of step S903 are examples of specific implementations for fabricating a transparent cavity layer having one-dimensional step height structures in one axis.

Based on the transparent cavity layer having the one-dimensional step structures in one axis, one-dimensional step structures in another axis can be fabricated with a similar method. In this way, a transparent cavity layer having two-dimensional step heights structures can be formed.

A snapshot mosaic transparent cavity layer can be formed by splicing multiple transparent cavity layers with the two-dimensional step structures together, where each transparent cavity layer having the two-dimensional step structures may be regarded as an area of the snapshot mosaic transparent cavity layer.

It should be noted that in fabricating the snapshot mosaic transparent cavity layer, one-dimensional step structures in one axis (for example, an X axis) area are fabricated first, and then step structures in the other axis (for example, a Y axis) are fabricated afterwards. In fabricating the snapshot mosaic transparent cavity layer, a method therefore is the same as a method for forming step structures in one axis area, only by designing the masks with divided areas.

Figure 15:
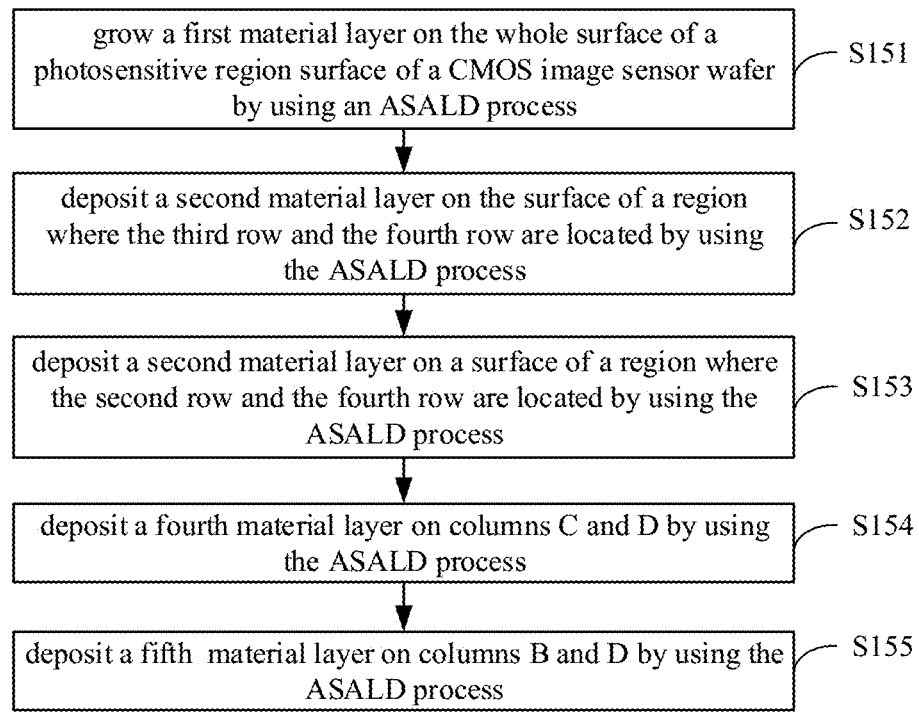
FIG. 15 shows a flowchart of a method for forming a snapshot mosaic transparent cavity layer having four 4×4 snapshot mosaic areas.

For example, FIG. 15 shows a flowchart of a method for forming a snapshot mosaic transparent cavity layer with four 4×4 snapshot mosaic areas. The method includes from steps S151 to S155 in the following.

In step S151, a first material layer is grown on a whole surface of the photosensitive region surface of a CMOS image sensor wafer by using ASALD process.

Figure 16A:
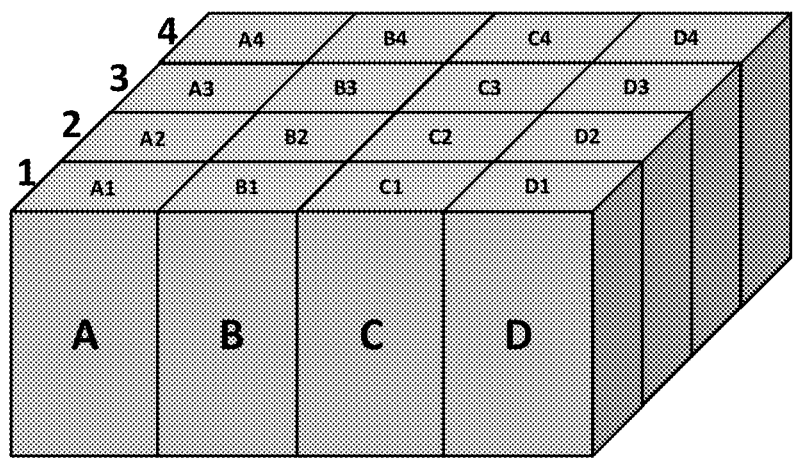
FIG. 16A to FIG. 16G are three dimensional of the structures according to a series of fabrication processes for forming a snapshot mosaic transparent cavity layer having four 4×4 snapshot mosaic areas.

As shown in FIG. 16A, the photosensitive region is divided into multiple structures by a 4×4 matrix. The matrix includes rows from 1 to 4 and columns from A to D. Step S151 includes growing a material layer on each row from 1 to 4 and each column from A to D. FIG. 16A shows a schematic structural stereogram corresponding to step S151. It should be noted that the first material layer has a thickness equal to the height of the bottom step in a transparent cavity layer.

In step S152, a second material layer is deposited on the surface of a region where the third row and the fourth row are located by using the ASALD process.

Figure 16B:
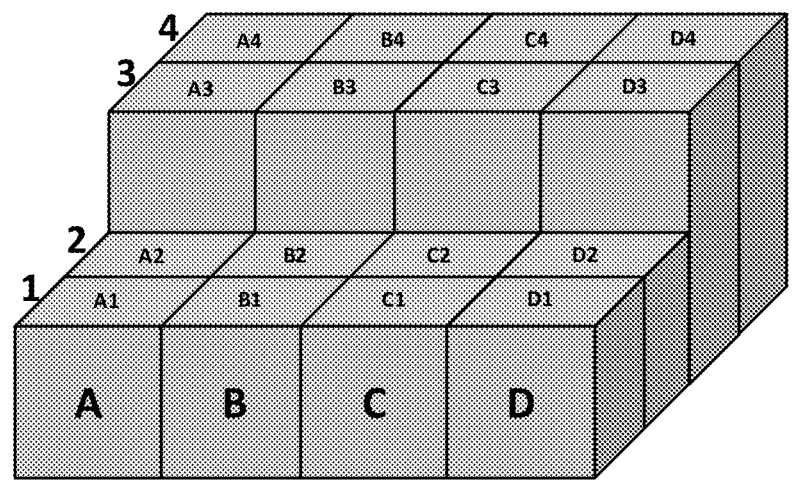

FIG. 16B shows a schematic structural stereogram corresponding to step S152. The second material layer has a thickness equal to the height of two common steps.

In step S153, a third material layer is deposited on a surface of a region where the second row and the fourth row are located by using the ASALD process.

Figure 16C:
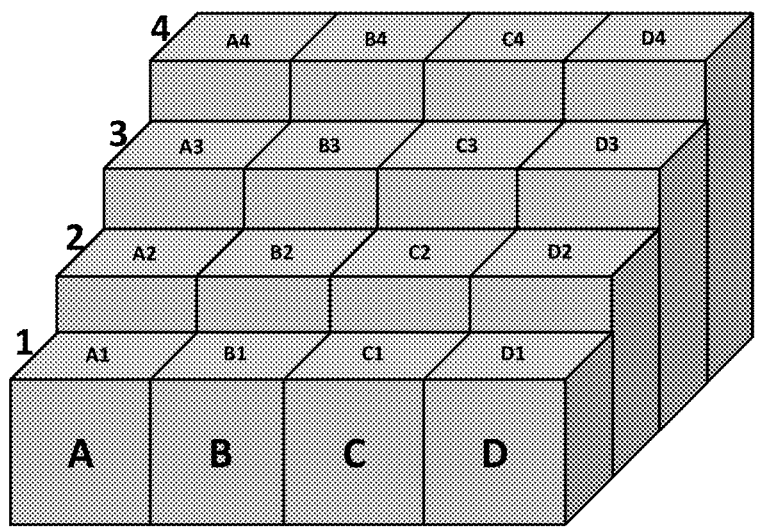

FIG. 16C shows a schematic structural stereogram corresponding to step S153. The third material layer has a thickness equal to the height of one common step.

Single axis one-dimensional structures in a row direction are formed by performing steps S151 to S153. A transparent cavity layer with the single axis one-dimensional structures can be used to form a hyperspectral image sensor of a line scan (line scan) structure.

In step S154, a fourth material layer is deposited on columns C and D by using the ASALD process.

Figure 16D:
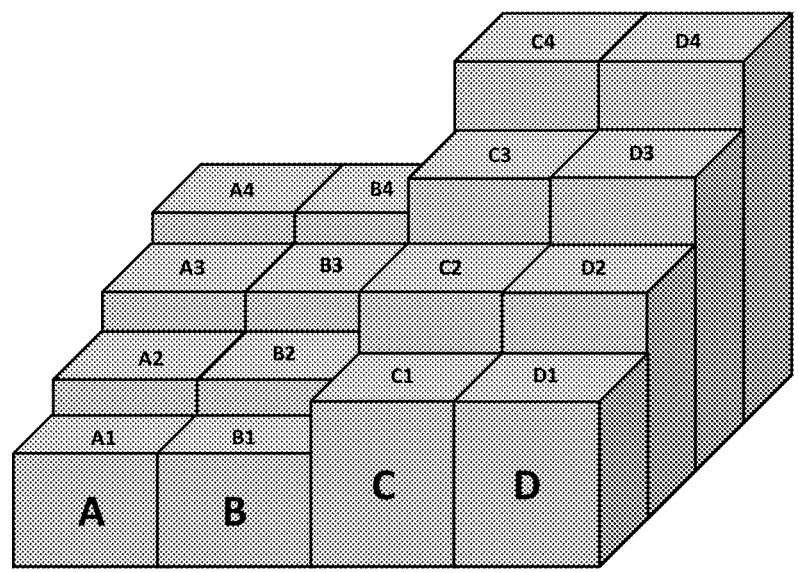

FIG. 16D shows a schematic structural stereogram corresponding to step S154. The fourth material layer has a thickness equal to the height of two common steps.

In step S155, a fifth material layer is deposited on columns B and D by using the ASALD process.

Figure 16E:
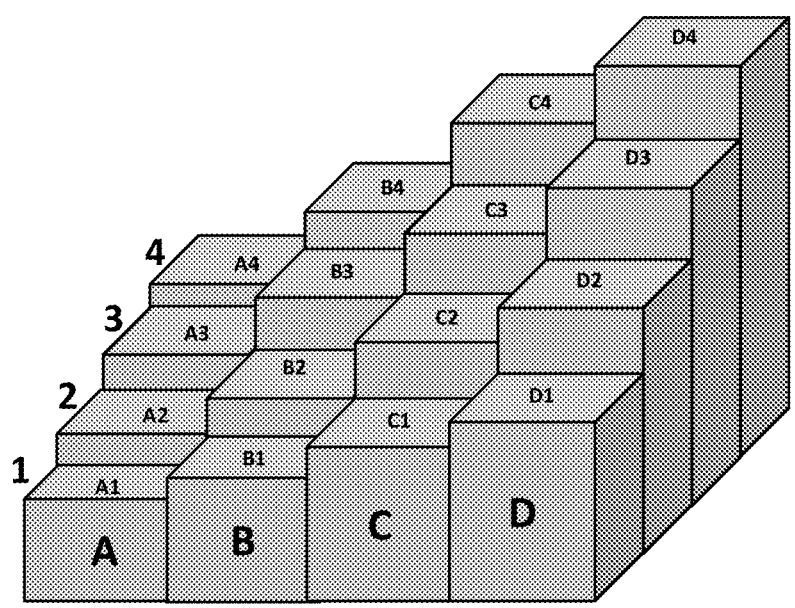

FIG. 16E shows a schematic structural stereogram corresponding to step S155. The fifth material layer has a thickness equal to the height of one common step.

Single axis one-dimensional step structures in a column direction are formed by performing steps S154 to S155.

In this way, a transparent cavity layer with two-dimensional step structures can be formed by performing steps S151 to S155. The formed transparent cavity layer with the two-dimensional step structures may function as one area of the snapshot mosaic transparent cavity layer with four 4×4 snapshot mosaic areas.

In step S156, four single area structures are combined together to form the snapshot mosaic transparent cavity layer with four 4×4 snapshot mosaic areas.

Figure 16F:
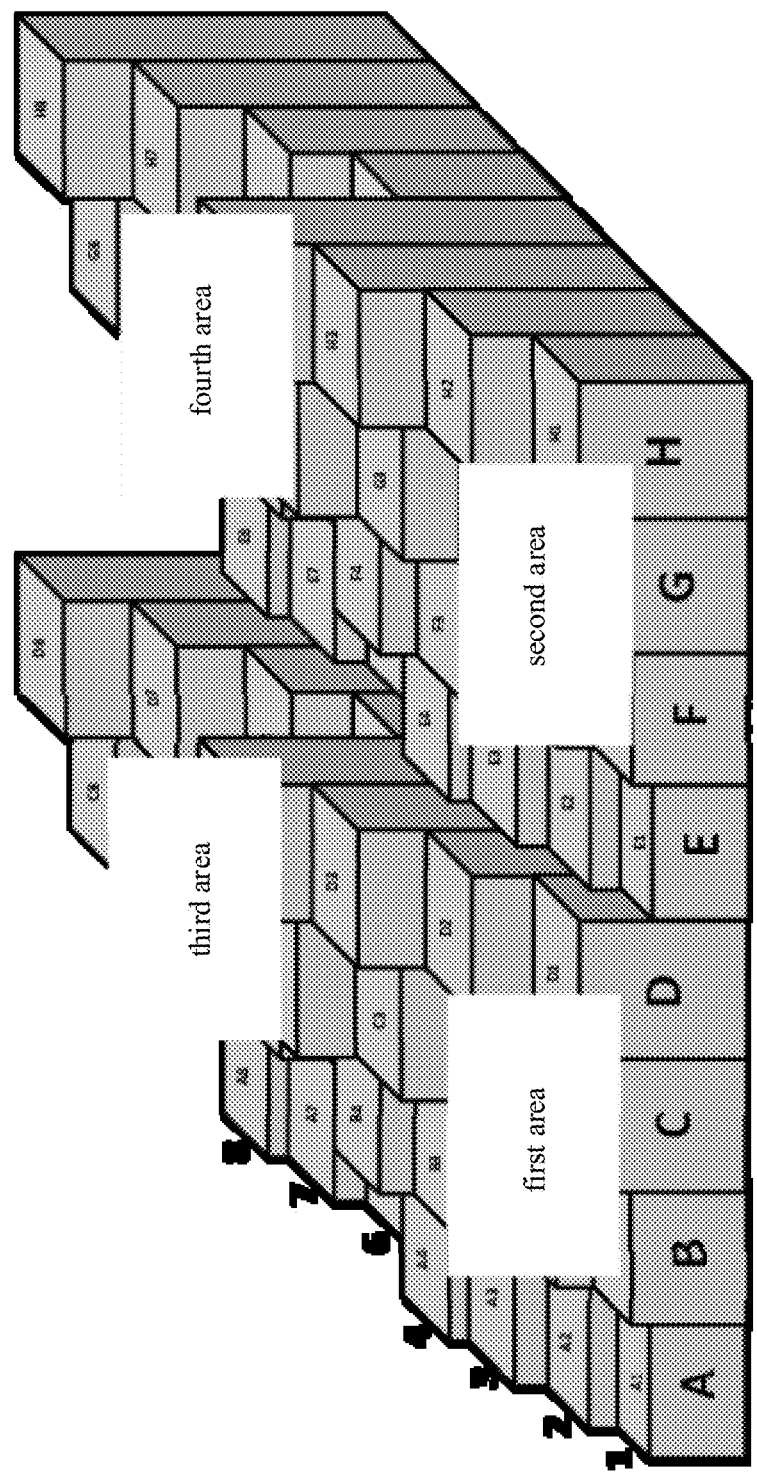
Figure 16G:
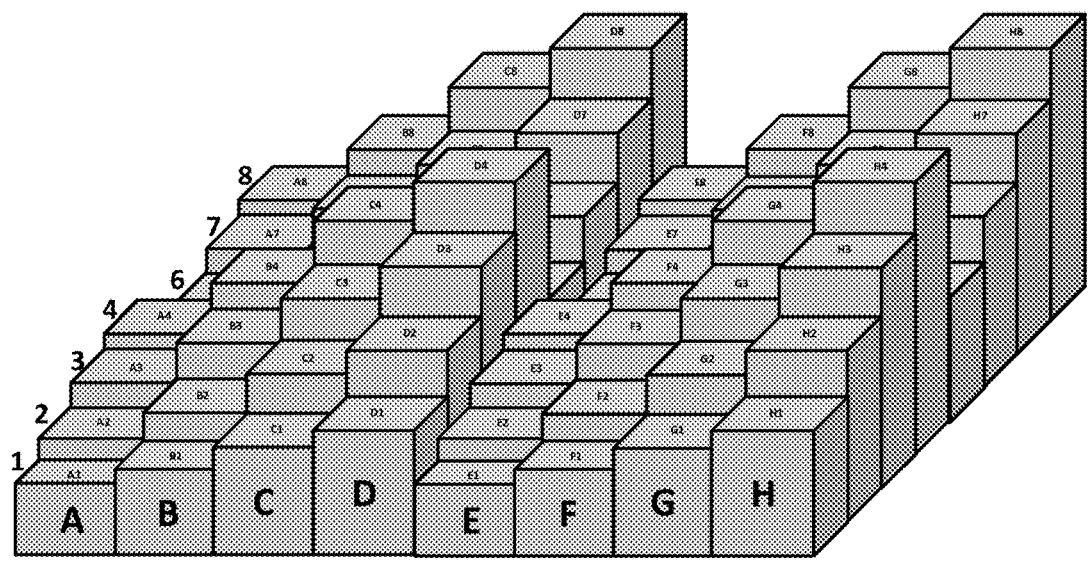

FIG. 16F and FIG. 16G are schematic structural stereograms of the snapshot mosaic transparent cavity layer with four 4×4 snapshot mosaic areas.

In step S904, a top reflecting layer is formed on the transparent cavity layer.

Figure 10D:
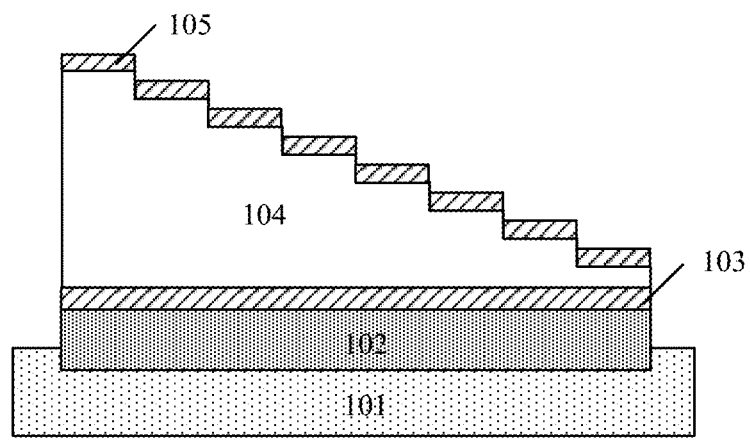

FIG. 10D shows a cross section of the structure corresponding to step S904, and a top reflecting layer 105 is formed on the transparent cavity layer 104.

It should be noted that steps S902 to S904 compose the process of fabricating a Fabry-Pérot interferometer. According to the steps, the Fabry-Pérot interferometer includes the bottom reflecting layer 103, the transparent cavity layer 104 formed on the bottom reflecting layer 103 and the top reflecting layer 105 formed on the transparent cavity layer 104.

A hyperspectral image sensor can be monolithically integrated through the above steps.

It should be noted that steps S902 to S904 compose the process of fabricating the Fabry-Pérot interferometer. With the above fabrication method, a Fabry-Pérot interferometer can be monolithically integrated with a CMOS image sensor, thereby forming a hyperspectral image sensor. The hyperspectral image sensor formed in such a way has features of small in volume, fast in analysis speed and low in cost.

In addition, in the embodiment of the present disclosure, the transparent cavity layer is formed by using the area selective atomic layer deposition process. As the atomic layer deposition process has a feature of excellent deposition uniformity, hence in the present disclosure, the N step structures formed on the bottom reflecting layer by using the area selective atomic layer deposition process have the same height. Thereby, the issue of height non-uniformity of step structures is greatly minimized with the method of monolithic integration of a hyperspectral image sensor according to the present disclosure. Heights of the formed step structures are determined by conditions of the area selective atomic layer deposition process, for example, the number of deposition cycles, and film deposition non-uniformity (<1.5%) of the ALD process is much smaller than that of the photolithography-etching process (2.7%) according to actual experience of growing the films (for example, ALD-$Al_2O_3$ films). In other words, film uniformity of the ALD process is better than that of the photolithography-etching process. Hence, with the method for monolithic integration of a hyperspectral image sensor according to the present disclosure, the issue of non-uniformity accumulation due to the etching process in conventional technology is greatly minimized, thereby being beneficial to reduce failure rate so to increase the yield of the devices.

In addition, the ALD process can be used to grow many types of film materials, and does not require that the materials can be etched easily. Hence, compared with the photolithography-etching process, the method for monolithic integration of a hyperspectral image sensor according to the present disclosure can be applied more widely in the aspect of material selection of a cavity layer.

The embodiments above are some preferred embodiments of the invention, and the invention is disclosed through the preferred embodiments which, however, are not intended to limit the invention. Those skilled in the art may make numerous possible alternations and modifications to the technical solutions according to the present disclosure or change the technical solutions into equivalent embodiments based on the disclosed methods and technical content, without deviating from the scope of technical solutions according to the present disclosure. Hence, any simple alternations, equivalents and modifications made to the embodiments based on the technical essence of the present disclosure without deviating from the content of the technical solutions according to the present disclosure shall fall within the scope of the technical solutions according to the present disclosure.

The invention claimed is:

1. A method for monolithic integration of a hyperspectral image sensor, comprising:
    preprocessing a surface of the photosensitive region of a CMOS image sensor wafer, to flatten the surface of the photosensitive region;
    forming a bottom reflecting layer on the preprocessed surface of the photosensitive region of the CMOS image sensor wafer;
    forming a transparent cavity layer on the bottom reflecting layer by using area selective atomic layer deposition processes, wherein the transparent cavity layer is composed of N step structures, wherein $N=2^m$, m>1 and m is a positive integer; and
    forming a top reflecting layer on the transparent cavity layer.

2. The method according to claim 1, wherein the forming a transparent cavity layer on the bottom reflecting layer by using an area selective atomic layer deposition process comprises:
    forming N step structures on the bottom reflecting layer by using the area selective atomic layer deposition process for m+1 times, wherein the N step structures form the transparent cavity layer.

3. The method according to claim 2, wherein,
    the forming N step structures on the bottom reflecting layer by using the area selective atomic layer deposition process for m+1 times comprises:
    dividing the surface of the bottom reflecting layer equally into N subregions;
    performing a first area selective atomic layer deposition process comprising depositing an initial material layer on each of the N subregions, wherein the initial material layer has a thickness equal to the height of a bottom step in the transparent cavity layer to be formed; and
    performing a $(1+i)^{th}$ area selective atomic layer deposition process comprising performing an area selective atomic layer deposition on $2^{(i-1)}$ subregions every other $2^{(i-1)}$ subregions, to form a material layer structure corresponding to the $i^{th}$ area selective atomic layer deposition process, wherein, the material layer structure grown through the $i^{th}$ area selective atomic layer deposition process has a thickness equal to a height of $2^{(i-1)}$ common steps, and the height of a common step is the height of a single step in the transparent cavity layer to be formed except a bottom step, wherein $i \in \{1, m\}$ and i is an integer.

4. The method according to claim 2, wherein a material composing the transparent cavity layer is a material grown by using the atomic layer deposition process with water as one of the precursors.

5. The method according to claim 4, wherein,
the forming N step structures on the bottom reflecting layer by using the area selective atomic layer deposition process for m+1 times comprises:
performing a first area selective atomic layer deposition process and a $(1+i)^{th}$ area selective atomic layer deposition process, wherein $i \in \{1, m\}$ and i is an integer;
the first area selective atomic layer deposition process comprises:
depositing an initial material layer on a whole surface of the bottom reflecting layer, wherein the initial material layer has a thickness equal to a height of the bottom step in the transparent cavity layer to be formed;
the $(1+i)^{th}$ area selective atomic layer deposition process comprises:
dividing the surface of the bottom reflecting layer equally into $2^i$ $i^{th}$ subregions; and
performing an area selective atomic layer deposition on an $i^{th}$ subregion every the other $i^{th}$ subregions, to form a material layer structure corresponding to the $i^{th}$ area selective atomic layer deposition process; and
the material layer structure grown through the $i^{th}$ area selective atomic layer deposition process has a thickness equal to the height of $2^{(m-i)}$ common steps, and a height of a common step is the height of a single step in the transparent cavity layer to be formed except the bottom step.

6. The method according to claim 4, wherein the material grown by using the atomic layer deposition process with water as one of the precursors comprises at least one of: $B_2O_3$, MgO, $Al_2O_3$, $SiO_2$, CaO, $Sc_2O_3$, $TiO_2$, $VO_x$, $CrO_x$, $FeO_x$, $CoO_x$, NiO, CuO, ZnO, $Ga_2O_3$, $GeO_2$, $SrO/SrCO_3$, $Y_2O_3$, $ZrO_2$, $Nb_2O_5$, $In_2O_3$, $Sb_2O_5$, $La_2O_3$, $PrO_x$, $Lu_2O_3$, $HfO_2$, $Ta_2O_5$, $WO_3$ and $BiO_x$.

7. The method according to claim 4, wherein the area selective atomic layer deposition process comprises:
processing a surface of the bottom reflecting layer with a reagent used for the surface hydrophobic treatment, to form a hydrophobic surface on a surface on which no atomic layer deposition material layer is to be grown;
performing an area selective atomic layer deposition on the processed surface of the bottom reflecting layer, to deposit an atomic layer deposition material layer on a non-hydrophobic surface; and
removing the reagent used for the surface hydrophobic treatment on the hydrophobic surface.

8. The method according to claim 7, wherein a reagent used for the surface hydrophobic treatment is the surface passivator.

9. The method according to claim 8, wherein the surface passivator is at least one of: octadecyltrichlorosilane, hexamethyl disilazane, octadecyltrimethoxysilane, octadecyltriethoxysilane and tridecafluoro-1,1,2,2-Tetrahydrooctychlorosilane.

10. The method according to claim 8, wherein the processing a surface of the bottom reflecting layer with a reagent used for the surface hydrophobic treatment, to form a hydrophobic surface on a surface on which no atomic layer deposition material layer is to be grown comprises:
coating the surface of the bottom reflecting layer with the surface passivator, to form a self-assembled monolayer on the surface of the bottom reflecting layer;
coating the bottom reflecting layer with the self-assembled monolayer with photoresist and baking the photoresist;
performing photolithographing, developing and weak plasma stripping on the bottom reflecting layer, to form a region covered with the photoresist and a region covered without the photoresist on the surface of the bottom reflecting layer, and removing a self-assembled monolayer on the region covered without the photoresist; and
stripping the photoresist to form a self-assembled monolayer on the region covered with the photoresist, wherein a surface region of the bottom reflecting layer on which the self-assembled monolayer is formed is a hydrophobic region.

11. The method according to claim 7, wherein the reagent used for the surface hydrophobic treatment is a patternable polymer.

12. The method according to claim 11, wherein the polymer is polymethyl methacrylate.

13. The method according to claim 11, wherein the processing a surface of the bottom reflecting layer with a reagent used for the surface hydrophobic treatment, to form a hydrophobic surface on a surface on which no atomic layer deposition material layer is to be grown comprises:
coating the surface of the bottom reflecting layer with a polymer film;
exposing the polymer film on a preset region of the surface of the bottom reflecting layer, wherein the preset region is a hydrophobic region to be formed;
removing the polymer film which is not exposed; and
performing soft baking on remained polymer film, afterwards performing vacuum baking to remove moisture in the polymer film, to keep the polymer film dry.

* * * * *